United States Patent [19]
Ito

[11] Patent Number: 5,138,665
[45] Date of Patent: Aug. 11, 1992

[54] AUDIO REPRODUCTION SYSTEM

[75] Inventor: Masahiko Ito, Kawagoe, Japan

[73] Assignee: Pioneer Electronic Corporation, Tokyo, Japan

[21] Appl. No.: 630,468

[22] Filed: Dec. 18, 1990

[30] Foreign Application Priority Data

Dec. 19, 1989 [JP] Japan .................................. 1-329180

[51] Int. Cl.[5] ..................... H03G 5/00; H03G 9/00; H03G 3/00
[52] U.S. Cl. ........................................ 381/104; 381/98; 381/101; 381/102; 381/107
[58] Field of Search ................. 381/98, 101, 102, 104, 381/106, 108, 107, 109; 455/177, 200; 338/132, 133, 176

[56] References Cited

U.S. PATENT DOCUMENTS

| | | | |
|---|---|---|---|
| 1,973,453 | 9/1934 | Whiting | 338/132 |
| 2,051,898 | 8/1936 | Roberts | 455/200 |
| 2,404,160 | 7/1946 | Boucke | 455/200 |
| 3,452,282 | 6/1969 | Beres | 381/101 |
| 3,723,938 | 3/1973 | Gramm | 338/176 |
| 3,732,373 | 5/1973 | Boyden | 381/102 |
| 4,274,074 | 6/1981 | Sakamoto | 338/160 |
| 4,320,534 | 3/1982 | Sakai | 381/102 |
| 4,809,336 | 2/1989 | Pritchard | 381/98 |

Primary Examiner—James L. Dwyer
Assistant Examiner—Jack Chiang
Attorney, Agent, or Firm—Sughrue, Mion, Zinn, Macpeak & Seas

[57] ABSTRACT

An audio reproduction system for use in an audio amplifier, for example, has a tone control unit for increasing or reducing a gain, or keeping an increased or reduced gain, of a signal if a particular frequency range of an audio signal supplied thereto, and a volume control unit for increasing or reducing the gain of the audio signal in a full effective frequency range. The tone and volume control units are ganged by a gain control unit, so that the gain which has been increased in the particular frequency by the tone control unit, can be controlled depending on the degree to which the gain has been increased by the volume control unit. The tone and volume control units may include variable resistors, respectively, whose movable contacts are interconnected. When the knob of the volume control unit is shifted toward a higher scale level position, the gain of the signal in the particular frequency range is lowered by the tone control unit, thereby preventing the reproduced sound from being distorted. When the knob of the volume control unit is shifted toward a lower scale level position, the gain of the signal in the particular frequency range is increased by the tone control unit.

19 Claims, 14 Drawing Sheets

AUDIO REPRODUCTION SYSTEM

BACKGROUND OF THE INVENTION

The present invention relates to an audio reproduction system such as an audio preamplifier, an audio control amplifier, or the like, and more particularly to an improved tone control apparatus for use in such an audio reproduction system.

Generally, preamplifiers and control amplifiers for use in stereo reproduction systems have tone control circuits for altering the frequency response of the amplifiers thereby to adjust the tone of reproduced sound. Graphic equalizers are used as an independent circuit for fine adjustment of the frequency response of amplifiers connected thereto. Human ears suffer the natural loss of hearing sensitivity at lower and higher frequencies when the level of the reproduced sound level is low. Loudness control circuits are employed to compensate for such a tendency of human hearing by boosting or emphasizing high and low frequencies so that the reproduced sound heard by human ears has apparently flat frequency characteristics. The above tone control circuits, graphic equalizers, and loudness control circuits will be refered to as tone control units.

In any of the above tone controls, the adjusted frequency characteristics of an audio signal can be adjusted again manually by using a control knob or the like, but has nothing to do with changes in the volume level. Therefore, the adjusted frequency characteristics of an audio signal remain the same irrespective of whether the volume level of the signal is increased or reduced.

In designing an audio main amplifier, the gain of the main amplifier is selected such that the reproduced sound will not be distorted when the volume level is maximum, in order to ensure powerful impressions which the listener will have when the signal is reproduced with high output power. However, the reproduced sound will nevertheless be distorted if a signal in excess of an allowable maximum level is applied to the main amplifier. Such an excess signal is given, for example, when the volume level is increased while lower frequencies are being emphasized by a tone control unit. If the volume level is increased while lower frequencies are being accentuated, then only the bass portion of the frequency spectrum will be distorted. Some small-size stereo reproduction systems have a circuit for emphasizing low frequencies because the loudspeakers are too small to reproduce low frequencies. Car audio stereo systems also incorporate FIX equalizers, DSP circuits, or the like to achieve particular frequency characteristics for improving the acoustic properties of passenger compartments of cars. The amplifiers for use in those stereo systems must be set at a low gain level to prevent the reproduced sound at particular frequencies from being distorted. If the gains are selected in the usual manner, then the reproduced sound will be distorted at particular frequencies when the volume level is increased. The low-frequency distortion is particularly liable to occur with car audio stereo amplifiers whose gains are low and whose maximum output power is small.

SUMMARY OF THE INVENTION

It is an object of the present invention to provide an audio reproduction system which includes means for correlating a tone control level to a volume level, so that the tone control level can automatically be controlled depending on the volume level.

According to the preferred embodiment of the present invention, there is provided an audio reproduction system comprising a tone control unit for controlling tones by increasing or reducing a gain, or keeping an increased or reduced gain, of a signal in a particular frequency range of an audio signal supplied thereto, a volume control unit for increasing or reducing a gain of the audio signal in a full effective frequency range, and a gain control unit for controlling the gain which has been increased in the particular frequency range by the tone control unit, depending on the degree to which the gain has been increased by the volume control unit.

The tone control unit includes a variable resistor for increasing or reducing the gain of the signal in the particular frequency range. The volume control unit also has a variable resistor which is interconnected to the variable resistor of the tone control unit through the gain control unit.

When the knob of the volume control unit is shifted toward a higher scale level position, the gain of the signal in the particular frequency range is lowered by the gain control unit, thereby preventing the reproduced sound from being distorted. When the knob of the volume control unit is shifted toward a lower scale level position, the gain of the signal in the particular frequency range is increased by the gain control unit.

The variable resistor of the tone control unit, which is interlinked with the variable resistor of the volume control unit, may have any of various different resistive characteristics to cause the signal gain to vary according to any of various patterns.

Each of the variable resistors of the tone and volume control units may comprise an arcuate or linear resistor and a slide contact slidable on the resistor.

Alternatively, the volume control unit may comprise a voltage controlled amplifier.

The tone control unit may comprise an analog-to-digital converter, a digital signal processor, and a digital-to-analog converter. The digital signal processor may be controlled by a system controller to vary the gain of the signal in the particular frequency range.

The audio reproduction system may further includes a limiter for limiting the gain of the signal from the volume control unit.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

First Embodiment

Figure 1A:
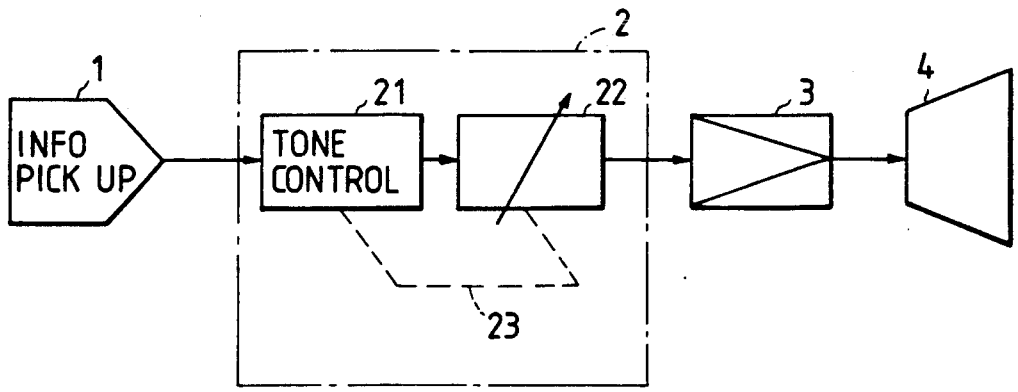
FIG. 1(A) is a block diagram of an audio reproduction system according to a first embodiment of the present invention.

FIG. 1(A) shows, in block form, an audio reproduction system according to a first embodiment of the present invention. The audio reproduction system shown in FIG. 1 includes an information pickup device 1, a frequency characteristics control device 2, an amplifier 3, and a loudspeaker 4. The information pickup device 1 is connected to the frequency characteristics control device 2, and has physical means for reading audio information recorded on a recording medium or audio information supplied from an external source, and converting the read audio information into an audio signal that is then applied to the frequency characteristics control unit 2. The information pickup device 1 may be a device, such as a compact disc player, an analog disc player, a cassette tape deck, a DAT deck, or the like, which reads recorded audio information from a recording medium and converts the audio information into an audio signal, or a device, such as an FM/AM tuner, a microphone, or the like, for reading audio information supplied from an external source and converting the audio information into an audio signal, or a device, such as a video tape recorder, a video disc player, a TV tuner, or the like, which separates and reads audio information from supplied audio-video signals and converts the audio information into an audio signal. The frequency characteristics control device 2 is connected to the output terminal of the information pickup device 1 and the input terminal of the amplifier 3. The frequency characteristics control device 2 controls the tone and volume of the audio signal received from the information pickup device 1, and supplies the audio signal with the controlled tone and volume to the amplifier 3. The amplifier 3 is connected to the output terminal of the frequency characteristics control device 2 and the input terminal of the loudspeaker 4. The amplifier 3 amplifies the audio signal received from the frequency characteristics control device 2, and applies the amplified audio signal to the loudspeaker 4. The loudspeaker 4 is connected to the output terminal of the amplifier 3, and coverts the audio signal received from the amplifier 3 into sound waves and radiates the sound waves.

The frequency characteristics control device 2 comprises a tone control unit 21, a volume control unit 22, and a gain control unit 23. The tone control unit 21 is connected to the output terminal of the information pickup device 1 and the input terminal of the volume control unit 22. The tone control unit 21 boosts (emphasizes) or reduces (attenuates) the gain of the audio signal, variably or in a fixed manner, in desired plural frequency ranges, and supplies the tone-controlled audio signal to the volume control unit 22. The tone control unit 21 may be a control unit, such as a tone control circuit or a graphic equalizer, which can boost or cut off the gain of the audio signal variably in desired plural frequency ranges, or a control unit, such as a loudness control circuit, for boosting or reducing the gain of the audio signal at certain points in the frequency range thereof with a fixed ratio based on a certain frequency characteristic curve, or for turning off the gain of the audio signal uniformly at certain points in the frequency range thereof, or a control unit, such as an RIAA characteristic equalizer or an NAB characteristic equalizer in a tape deck, for boosting or reducing the gain of the audio signal at certain points in the frequency range thereof with a fixed ratio based on a certain frequency characteristic curve, or a sound field control circuit, such as an FIX equalizer, a DSP circuit, or the like, which has fixed or variable frequency characteristics. The volume control unit 22 is connected to the output terminals of the tone control unit 21 and the input terminal of the amplifier 3. The volume control unit 22 is externally operated on to control the volume level of the audio signal from a zero level to a maximum level, and applies the audio signal with the volume level controlled to the amplifier 3. The gain control unit 23 is connected to the volume control unit 22 and the tone control unit 21. When the volume level of the volume control unit 22 is high, the gain control unit 23 continuously or discontinuously lowers the gain of the tone control unit 21. When the volume level of the volume control unit 22 is low, the gain control unit 23 continuously or discontinuously increases the gain of the tone control unit 21.

Operation of the audio reproduction system shown in FIG. 1(A) will be described below.

The information pickup unit 1 reads audio information, converts the audio information into an audio signal, and applies the audio signal to the frequency characteristics control device 2.

In the frequency characteristics control device 2, the tone control unit 21 adjusts the frequency characteristics (tone characteristics) of the audio signal received from the information pickup unit 1, and supplies the audio signal with the adjusted frequency characteristics to the volume control unit 22.

The volume control unit 22 is then externally operated on to control the overall signal level (volume level) of the audio signal received from the tone control unit 21 between the zero level and the maximum level, and transmits the audio signal with the adjusted volume level to the amplifier 3.

When the volume level of the volume control unit 22 increases, the gain control unit 23 operates the volume control unit 22 and the tone control unit 21 in linked relation with a mechanical or electrical arrangement for continously or discontinuously reducing the gain of the audio signal at points in the frequency range thereof which are set by the tone control unit 21. When the volume level of the volume control unit 22 decreases, the gain control unit 23 operates the volume control unit 22 and the tone control unit 21 in linked relation with the mechanical or electrical arrangement for continuously or discontinuously increasing the gain of the audio signal at points in the frequency range thereof which are selected by the tone control unit 21.

The amplifier 3 amplifies the audio signal received from the volume control unit 22 with a given amplification factor, and supplies the amplified audio signal to the loudspeaker 4.

The loudspeaker 4 converts the audio electric signal received from the amplifier 3 into sound waves, and radiates the sound waves.

Figure 1B:
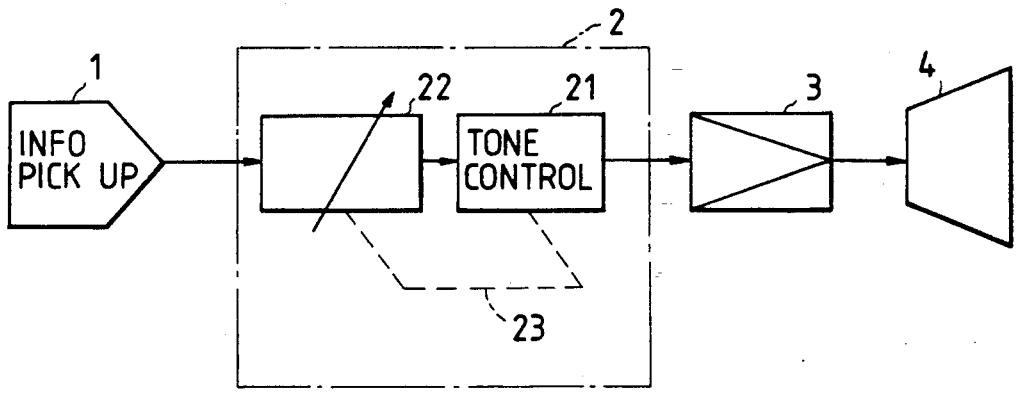
FIG. 1(B) is a block diagram of a modification of the audio reproduction system shown in FIG. 1(A)

FIG. 1(B) shows a modified audio reproduction system according to the present invention. The modified audio reproduction system shown in FIG. 1(B) structurally differs from the audio reproduction system shown in FIG. 1(A) only in that the tone control unit 21 and the volume control unit 22 are switched around in position. The modified audio reproduction system shown in FIG. 1(B) is functionally identical to the audio reproduction system shown in FIG. 1(A).

Second Embodiment

Figure 2:
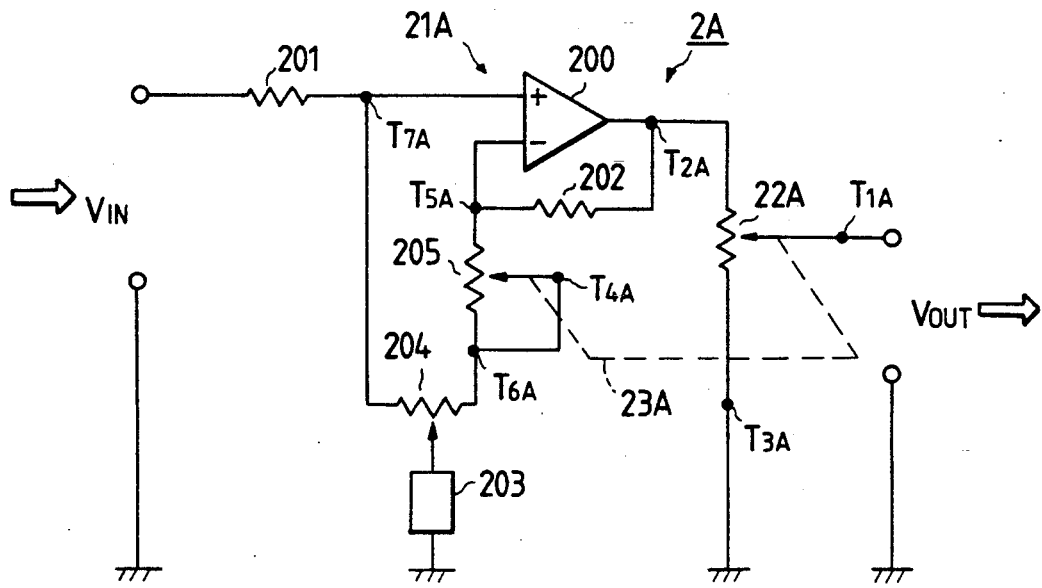
FIGS. 2 through 6 are circuit diagrams of frequency characteristics control devices according to second through sixth embodiments of the present invention.

FIG. 2 shows a frequency characteristics control device according to a second embodiment of the present invention, for use in an audio reproduction system. The frequency characteristics control device, generally denoted at 2A, comprises a tone control circuit 21A as a tone control unit, a volume control 22A as a volume control unit, and a gain control unit 23A.

The tone control circuit 21A comprises a noninverting amplifier 200, resistors 201, 202, a circuit 203 composed of series- and parallel-connected capacitors and resistors, and variable resistors 204, 205.

The noninverting amplifier 200 has a positive input terminal which is connected at a junction $T_{7A}$ to one terminal of the resistor 201, whose other terminal serves as a positive input terminal of the frequency characteristics control device 2A. The circuit 203 has one terminal grounded and another terminal connected to the movable contact of the variable resistor 204. One fixed terminal of the variable resistor 204 is connected to the junction $T_{7A}$, and the other fixed terminal thereof is connected at a junction $T_{6A}$ to one fixed terminal of the variable resistor 205 and also to the movable terminal $T_{4A}$ of the variable resistor 205. The other fixed terminal of the variable resistor 205 is connected at a junction $T_{5A}$ to a negative input terminal of the noninverting amplifier 200 and also to one terminal of the resistor 202. The other terminal of the resistor 202 is joined at a junction $T_{2A}$ to the output terminal of the noninverting amplifier 200, the resistor 202 serving as a negative feedback resistor connected across the noninverting amplifier 200. The junction $T_{2A}$ is coupled to one fixed terminal of the volume control 22A in the form of a variable resistor, whose other fixed terminal is connected to ground. The volume control 22A has a movable terminal $T_{1A}$ serving as a positive output terminal of the frequency characteristics control device 2A. The movable contact of the variable resistor 205 and the movable contact of the volume control 22A are linked with each other by the gain control unit 23A.

The frequency characteristics control device 2A operates as follows:

An audio signal applied between input terminals $V_{IN}$ has a boosted component in a frequency range which is determined by the CR value of the circuit 203, the boosted component being increased or reduced by the variable resistor 205. The boosted component is increased or reduced in mechanical or electrically ganged relation to operation of the volume control 22A through the gain control unit 23A. Specifically, when the volume control 22A is shifted toward a higher scale level, the variable resistor 205 is automatically shifted toward a higher resistance by the gain control unit 23A, i.e., shifted in a direction to reduce the current flowing between the circuit 203 and the negative input terminal of the noninverting amplifier 200.

Therefore, as the volume control 22A is shifted from a lower scale level toward a higher scale level, the boosted or emphasized level of the audio signal in the determined frequency range is continuously or discontinuously lowered. The frequency characteristics control device 2A is advantageous in that it is of a relatively simple circuit arrangement and the reduction of the boosted level in the determined frequency range is natural because the boosted level is gradually and smoothly reduced. When the volume level of the volume control 22A is lowered, the above process is reversed.

Third Embodiment

Figure 3:
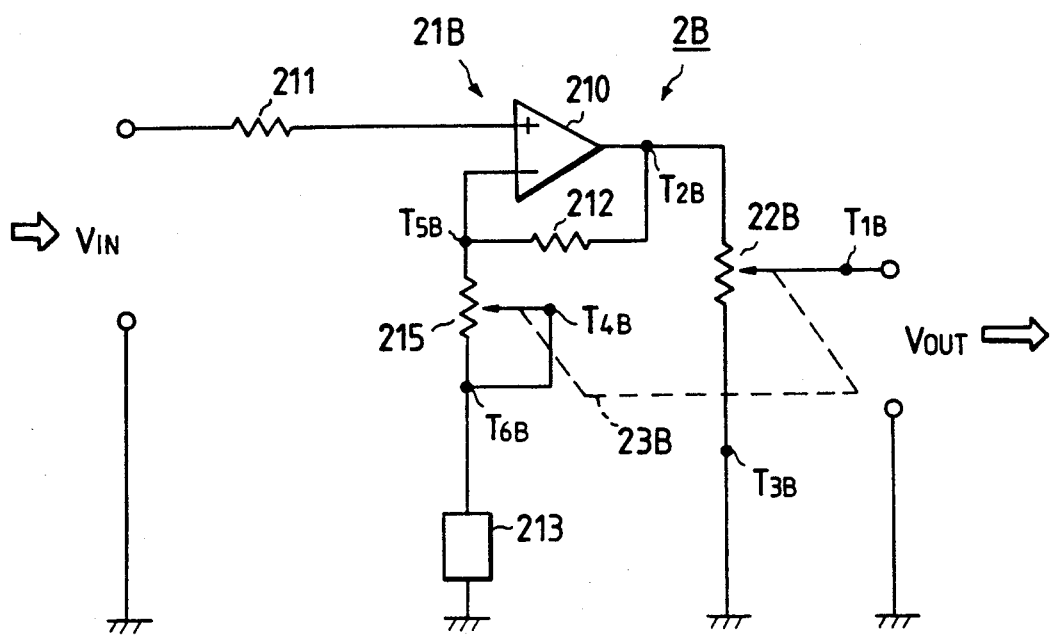

FIG. 3 shows a frequency characteristics control device 2B according to a third embodiment of the present invention, for use in an audio reproduction system. The frequency characteristics control device 2B is functionally identical to the frequency characteristics control device 2A shown in FIG. 2.

The frequency characteristics control device 2B shown in FIG. 3 comprises a tone control circuit 21B as a tone control unit, a volume control 22B as a volume control unit, and a gain control unit 23B.

The tone control circuit 21B comprises a noninverting amplifier 210, resistors 211, 212, a circuit 213 composed of series- and parallel-connected capacitors and resistors, and a variable resistor 215.

The noninverting amplifier 210 has a positive input terminal which is connected to one terminal of the resistor 211, whose other terminal serves as a positive input terminal of the frequency characteristics control device 2B. The circuit 213 has one terminal grounded and another terminal connected at a junction $T_{6B}$ to one fixed terminal of the variable resistor 215 and also to the movable contact $T_{4B}$ of the variable resistor 215. The other fixed terminal of the variable resistor 215 is connected at a junction $T_{5B}$ to the negative input terminal of the noninverting amplifier 210 and also to one terminal of the resistor 212. The other terminal of the resistor 212 is joined at a junction $T_{2B}$ to the output terminal of the noninverting amplifier 210, the resistor 212 serving as a negative feedback resistor connected across the noninverting amplifier 210. The junction $T_{2B}$ is coupled to one fixed terminal of the volume control 22B in the form of a variable resistor, whose other fixed terminal is connected to ground. The volume control 22B has a movable terminal $T_{1B}$ serving as a positive output terminal of the frequency characteristics control device 2B. The movable contact of the variable resistor 215 and the movable contact of the volume control 22B are ganged with each other by the gain control unit 23B. When the volume control 22B is shifted from a lower scale level toward a higher scale level, the boosted or emphasized level of the audio signal in the determined frequency range (tone control level) is continuously or discontinuously lowered.

When the volume level of the volume control 22B is lowered, the above process is reversed.

Fourth Embodiment

Figure 4:
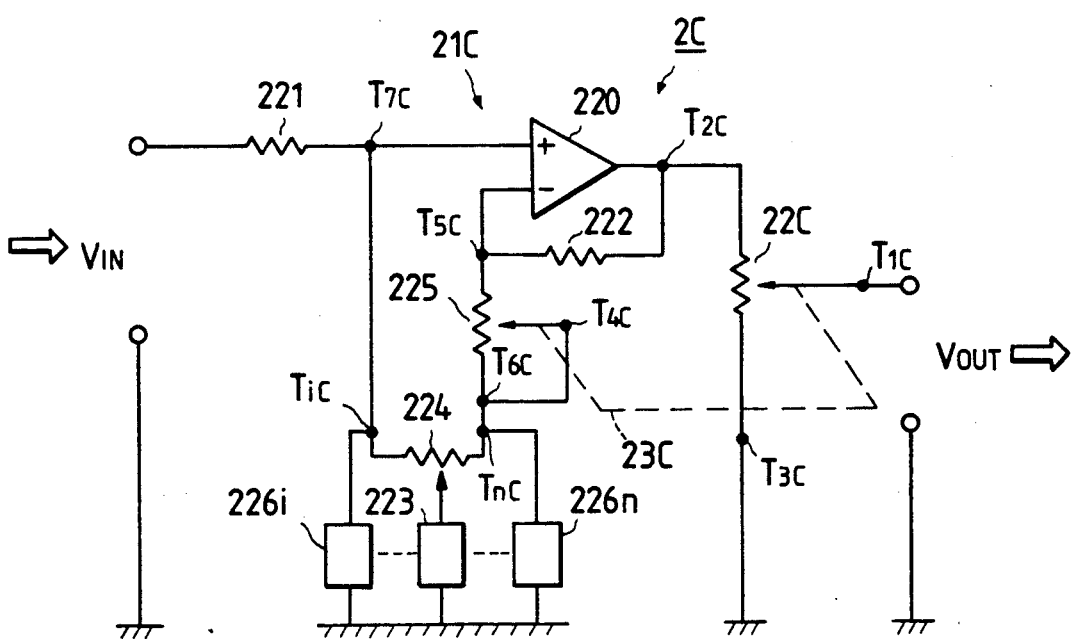

FIG. 4 shows a frequency characteristics control device 2C according to a fourth embodiment of the present invention, for use in an audio reproduction system. The frequency characteristics control device 2C is capable of freely determining a frequency range in which the audio signal can be controlled.

The frequency characteristics control device 2C comprises a tone control circuit 21C as a tone control unit, a volume control 22C as a volume control unit, and a gain control unit 23C.

The tone control circuit 21C comprises a noninverting amplifier 220, resistors 221, 222, a plurality of circuits 223, $226_i$ through $226_n$ each composed of series- and parallel-connected capacitors and resistors, and variable resistors 224, 225.

The noninverting amplifier 220 has a positive input terminal which is connected at a junction $T_{7C}$ to one terminal of the resistor 221, whose other terminal serves as a positive input terminal of the frequency characteristics control device 2C. The circuit 223 has one terminal grounded and another terminal connected to the movable contact of the variable resistor 224. The circuits $226_i$ through $226_n$ have terminals grounded on one side, and other terminals connected at respective junctions $T_{iC}$ through $T_{nC}$ to either one of the fixed terminals of the variable resistor 224. One of the fixed terminals of the variable resistor 224 is connected to the junction $T_{7C}$, and the other fixed terminal thereof is connected at a junction $T_{6C}$ to one fixed terminal of the variable resistor 225 and also to the movable terminal $T_{4C}$ of the variable resistor 225. The other fixed terminal of the variable resistor 225 is connected at a junction $T_{5C}$ to a negative input terminal of the noninverting amplifier 220 and also to one terminal of the resistor 222. The other terminal of the resistor 222 is joined at a junction $T_{2C}$ to the output terminal of the noninverting amplifier 220, the resistor 222 serving as a negative feedback resistor connected across the noninverting amplifier 220. The junction $T_{2C}$ is coupled to one fixed terminal of the volume control 22C in the form of a variable resistor, whose other fixed terminal is connected to ground. The volume control 22C has a movable terminal $T_{1C}$ serving as a positive output terminal of the frequency characteristics control device 2C. The movable contact of the variable resistor 225 and the movable contact of the volume control 22C are linked with each other by the gain control unit 23C.

When the volume control 22C is shifted from a lower scale level toward a higher scale level, the boosted or emphasized level of the audio signal in the determined frequency range is continuously or discontinuously lowered, and the frequency range in which the audio signal is to be controlled can freely be selected at the time the frequency characteristics control device 2C is manufactured.

When the volume level of the volume control 22C is lowered, the above process is reversed.

Fifth Embodiment

Figure 5:
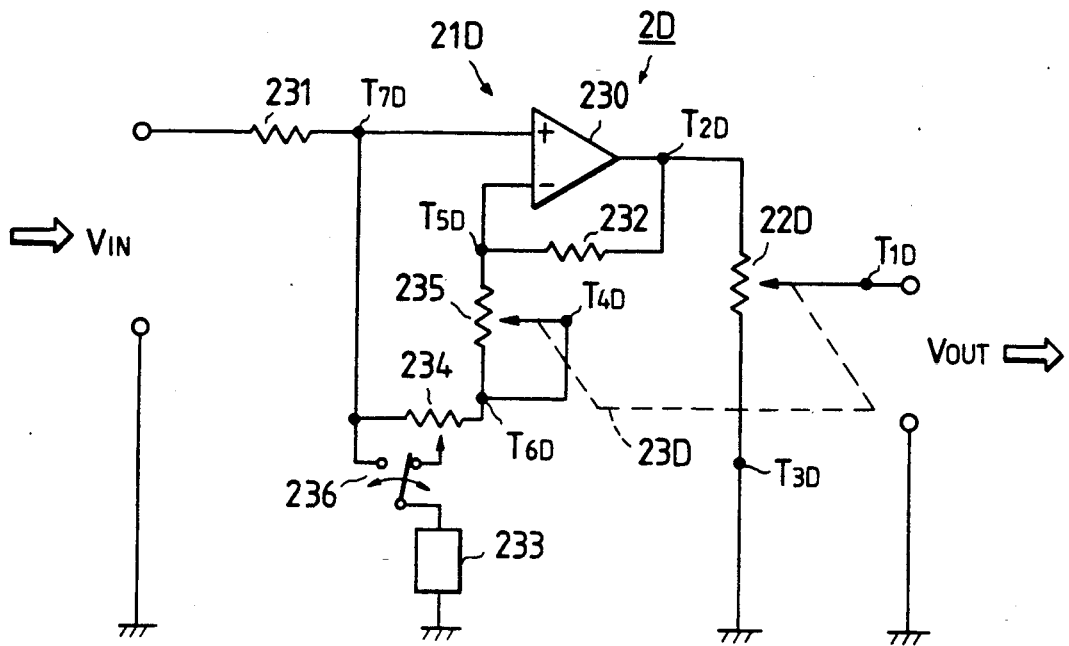

FIG. 5 shows a frequency characteristics control device 2D according to a fifth embodiment of the present invention, for use in an audio reproduction system. The frequency characteristics control device 2D includes a loudness control circuit for turning on or off the gain of the audio signal in a certain frequency range, or for uniformly increasing the gain up to a certain boosted level or turning off the gain.

The frequency characteristics control device 2D shown in FIG. 5 comprises a loudness control circuit 21D as a tone control unit, a volume control 22D as a volume control unit, and a gain control unit 23D.

The loudness control circuit 21D comprises a noninverting amplifier 230, resistors 231, 232, a circuit 233 composed of series- and parallel-connected capacitors and resistors, variable resistors 234, 235, and a switch 236.

The noninverting amplifier 230 has a positive input terminal which is connected at a junction $T_{7D}$ to one terminal of the resistor 231, whose other terminal serves as a positive input terminal of the frequency characteristics control device 2D. The circuit 233 has one terminal grounded and another terminal connected to a switch 236. The switch 236 is coupled between the movable contact of the variable resistor 234 and the circuit 233, and has a movable contact which can selectively be connected to the movable contact of the variable resistor 234 and the junction $T_{7D}$. One fixed terminal of the variable resistor 234 is connected to the junction $T_{7D}$, and the other fixed terminal thereof is connected at a junction $T_{6D}$ to one fixed terminal of the variable resistor 235 and also to the movable contact $T_{4D}$ of the variable resistor 235. The other fixed terminal of the variable resistor 235 is connected at a junction $T_{5D}$ to the negative input terminal of the noninverting amplifier 230 and also to one terminal of the resistor 232. The other terminal of the resistor 232 is joined at a junction $T_{2D}$ to the output terminal of the noninverting amplifier 230, the resistor 232 serving as a negative feedback resistor connected across the noninverting amplifier 230. The junction $T_{2D}$ is coupled to one fixed terminal of the volume control 22D in the form of a variable resistor, whose other fixed terminal is connected to ground. The volume control 22D has a movable terminal $T_{1D}$ serving as a positive output terminal of the frequency characteristics control device 2D. The movable contact of the variable resistor 235 and the movable contact of the volume control 22D are ganged with each other by the gain control unit 23D. When the volume control 22D is shifted from a lower scale level toward a higher scale level, the boosted or emphasized level of the audio signal in the frequency range, which is determined when the loudness control circuit 21D is turned on, is continuously or discontinuously lowered.

When the volume level of the volume control 22 D is lowered, the above process is reversed.

Sixth Embodiment

Figure 6:
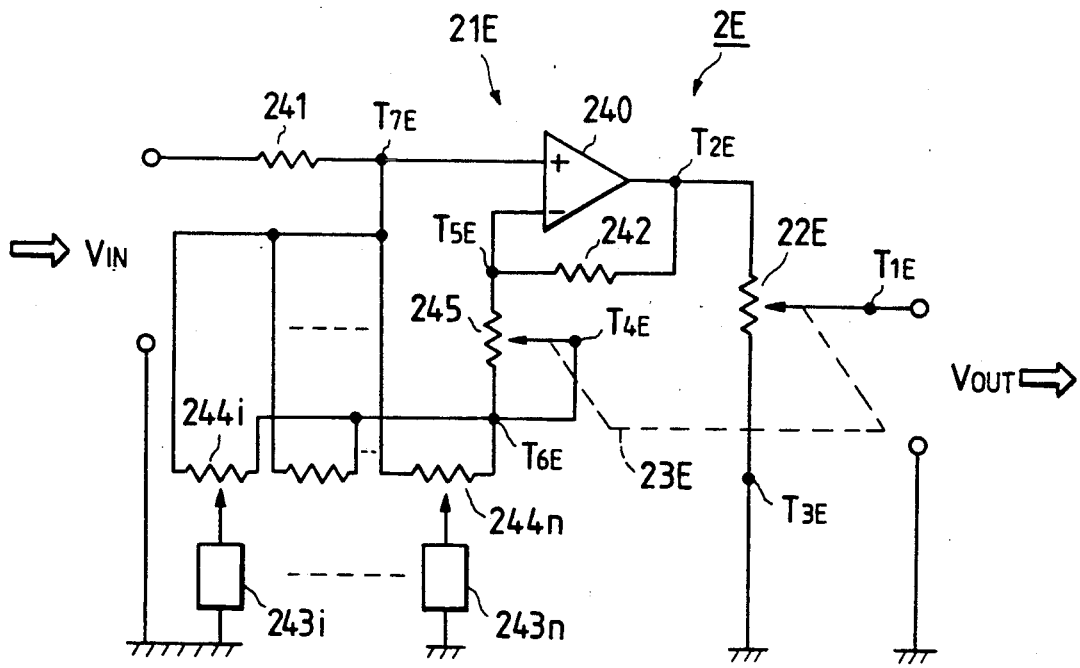

FIG. 6 shows a frequency characteristics control device 2E according to a sixth embodiment of the present invention, for use in an audio reproduction system. The frequency characteristics control device 2E includes a tone control circuit or a graphic equalizer which has bass, treble, and midrange control knobs for boosting or reducing the gain of the audio signal variably in a plurality of frequency ranges.

The frequency characteristics control device 2E comprises a tone control circuit 21E as a tone control unit, a volume control 22E as a volume control unit, and a gain control unit 23E.

The tone control circuit 21E comprises a noninverting amplifier 240, resistors 241, 242, a plurality of circuits $243_i$ through $243_n$ each composed of series- and parallel-connected capacitors and resistors, and a plurality of variable resistors $244_i$ through $244_n$ and 245.

The noninverting amplifier 240 has a positive input terminal which is connected at a junction $T_{7E}$ to one terminal of the resistor 241, whose other terminal serves as a positive input terminal of the frequency characteristics control device 2E. The circuits $243_i$ through $243_n$ have one respective terminals grounded, and other terminals connected to the movable contacts of the respective variable resistors $244_i$ through $244_n$, which have one fixed terminals connected to the junction $T_{7E}$. The other fixed terminals of the variable resistors $244_i$ through $244_n$ are connected at a junction $T_{6E}$ to one fixed terminal of the variable resistor 245 and also to the movable terminal $T_{4E}$ of the variable resistor 245. The other fixed terminal of the variable resistor 245 is connected at a junction $T_{5E}$ to a negative input terminal of the noninverting amplifier 240 and also to one terminal of the resistor 242. The other terminal of the resistor 242 is joined at a junction $T_{2E}$ to the output terminal of the noninverting amplifier 240, the resistor 242 serving as a negative feedback resistor connected across the noninverting amplifier 240. The junction $T_{2E}$ is coupled to one fixed terminal of the volume control 22E in the form of a variable resistor, whose other fixed terminal is connected to ground. The volume control 2E has a movable terminal $T_{1E}$ serving as a positive output terminal of the frequency characteristics control device 2E. The movable contact of the variable resistor 245 and the movable contact of the volume control 22E are ganged with each other by the gain control unit 23E.

When the volume control 22E is shifted from a lower scale level toward a higher scale level, the boosted or emphasized level of the audio signal in the plural frequency ranges, which are determined by the tone control circuit 21E, is continuously or discontinuously lowered.

When the volume level of the volume control 22E is lowered, the above process is reversed.

Specific arrangement of frequency characteristic control device

Figure 7A:
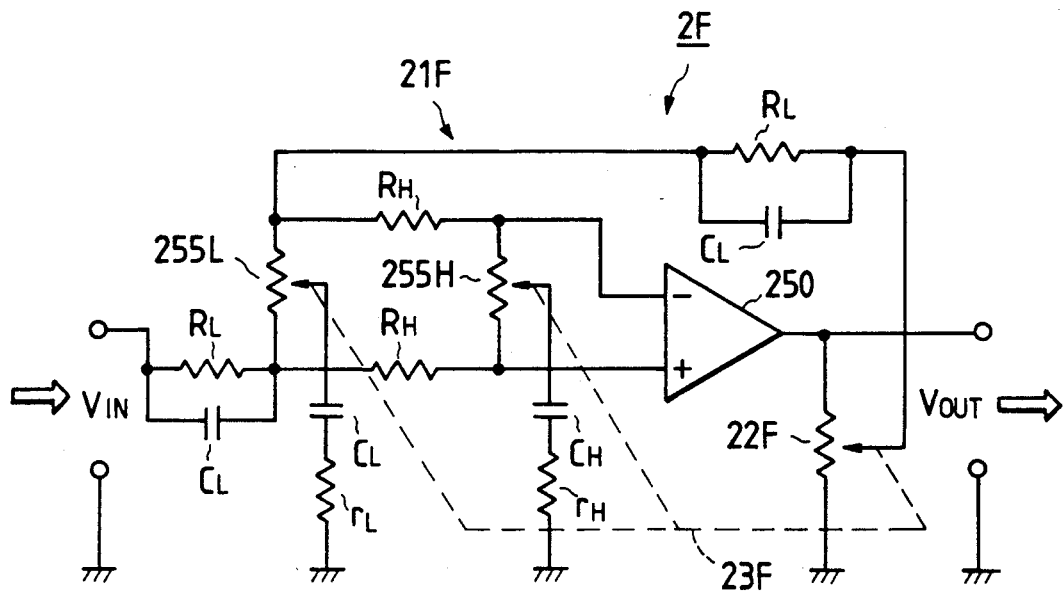
FIG. 7(A) is a detailed circuit diagram of a frequency characteristics control device according to the present invention.

FIG. 7(A) shows a specific circuit arrangement of a frequency characteristic control device.

The frequency characteristics control device, generally denoted at 2F, comprises a tone control circuit 21F as a tone control unit, a volume control 22F as a volume control unit, and a gain control unit 23F.

The tone control circuit 21F comprises a noninverting amplifier 250, resistors $R_L$, $R_H$, $r_L$, $r_H$, capacitors $C_L$, $C_H$, and variable resistors 255L, 255H. The variable resistor 255L is used to control the bass level, and the variable resistor 255H is used to control the treble level. The movable contacts of the variable resistors 255L, 255H and the movable contact of the volume control 22F are ganged with each other by the gain control unit 23F.

Figure 7B:
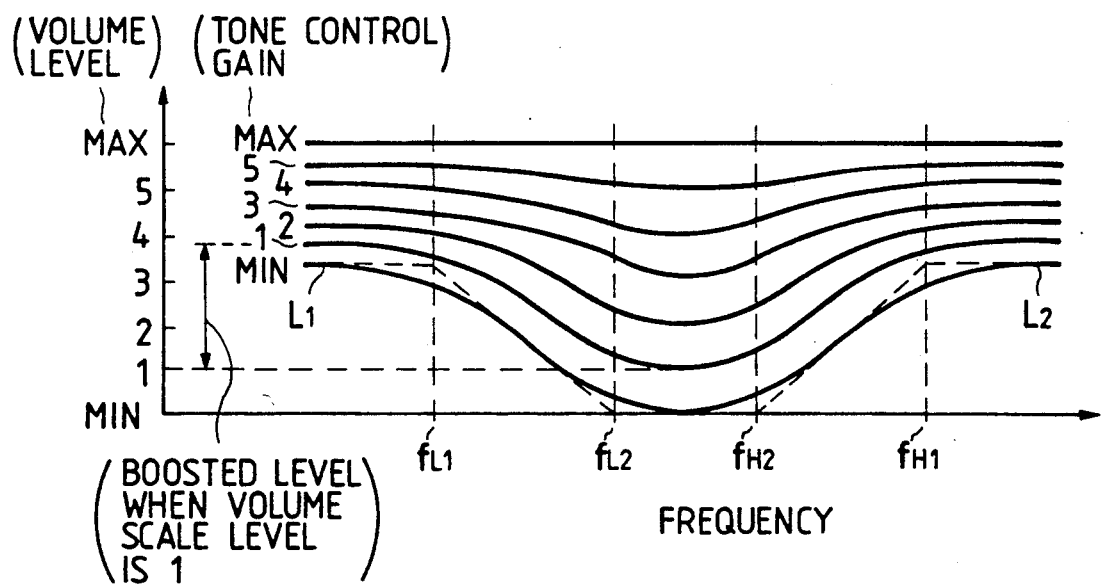
FIG. 7(B) is a diagram showing operation of the frequency characteristics control device shown in FIG. 7(A)

FIG. 7(B) shows the operation of the frequency characteristics control device 2F shown in FIG. 7(A). The graph of FIG. 7(B) has a horizontal axis representing frequencies and a vertical axis signal levels. Denoted on the horizontal axis at $f_{L1}$ is a cutoff frequency for the bass level boost, $f_{L2}$ a frequency for starting the bass level boost, $f_{H1}$ a cutoff frequency for the treble level boost, and $f_{H2}$ a frequency for starting the treble level boost. These frequencies are expressed as follows:

$$f_{L1} = \frac{1}{2\pi C_L R_L}$$

$$f_{L2} = \frac{(R_L + r_L)}{2\pi C_L R_L r_L}$$

$$f_{H1} = \frac{1}{2\pi C_H R_H}$$

$$f_{H2} = \frac{1}{2\pi C_L R_L (R_H + r_H)}$$

The bass level can be adjusted from a minimum zero level to a maximum level $L_1$ by the variable resistor 255L, and the treble level can be adjusted from a minimum zero level to a maximum level $L_2$ by the variable resistor 255H.

When the volume control 22F is shifted from a lower scale level toward a higher scale level, the boosted or emphasized level of the audio signal in the bass and treble frequency ranges, which are determined by the tone control circuit 21F, is continuously or discontinuously lowered.

When the volume level of the volume control 22F is lowered, the above process is reversed.

Ganged mechanism 1

Figure 8:
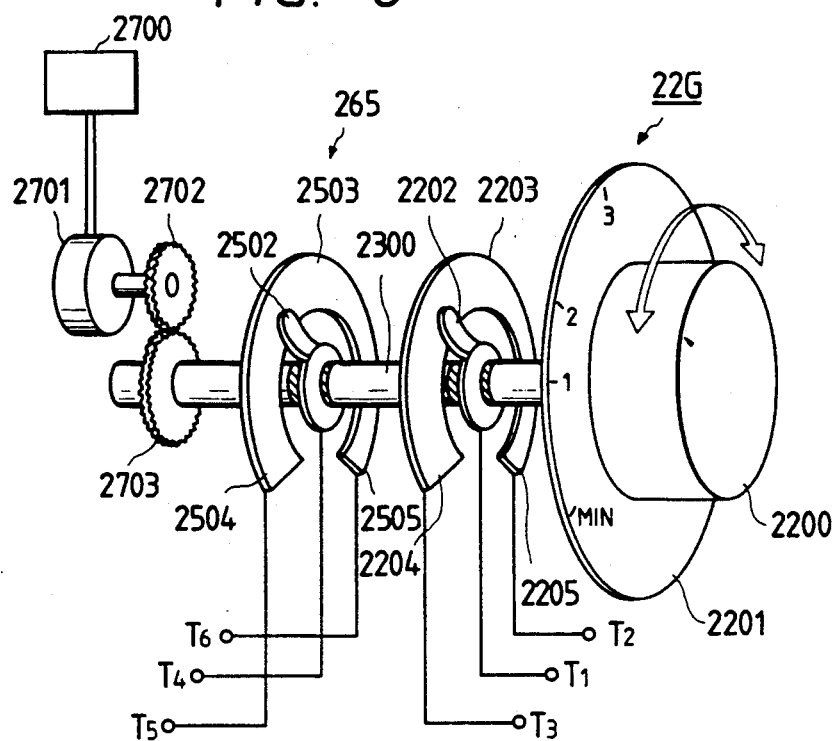
FIGS. 8 through 10 are views of different linked mechanisms for an audio reproduction system according to the present invention.

FIG. 8 shows a mechanism comprising a volume control, variable resistors, and a gain control unit for use in an audio reproduction system according to the present invention.

The mechanism shown in FIG. 8 has a knob 2200, a gain control unit or knob shaft 2300 coaxially coupled to the knob 2200, two slide contacts 2202, 2502 of an electrically conductive material which are mounted on the knob shaft 2300 in electrically insulated relation thereto, an arcuate electric resistor 2203 fixedly positioned around the knob shaft 2300 and held in contact with the slide contact 2202, and an arcuate electric resistor 2503 fixedly positioned around the knob shaft 2300 and held in contact with the slide contact 2502. The knob 2200, the knob shaft 2300, the slide contact 2202, and the arcuate electric resistor 2203 jointly serve as a volume control 22G which is functionally identical to each of the volume controls 22A through 22F shown in FIGS. 2 through 7. The knob shaft 2300, the slide contact 2502, and the electric resistor 2503 jointly serve as a variable resistor 265 which has the same function as that of each of the variable resistors 205, 214, 225, 235, 245, 255L, 255H shown in FIGS. 2 through 7, i.e., to increase and reduce the gain of the audio signal set by the tone control circuit. Terminals $T_1$ through $T_6$ are connected to the junctions $T_1$ through $T_6$ (e.g., $T_{1A}$ through $T_{6A}$ in FIG. 2) shown in FIGS. 2 through 7 and 16, 17. The terminals $T_2$, $T_3$ are also connected to respective opposite terminals 2205, 2204 of the electric resistor 2203. The terminal $T_5$, $T_6$ are connected to respective opposite terminals 2504, 2505 of the electric resistor 2503. The terminal $T_1$, $T_4$ are connected to the slide contact 2202, 2502.

The volume control 22G minimizes the volume level when the slide contact 2202 is positioned at the terminal 2204 of the electric resistor 2203. When the knob 2200 is turned clockwise in FIG. 8, the volume level is increased by the volume control 22G. When the slide contact 2202 is positioned at the terminal 2205 of the electric resistor 2203, the volume control 22G maximizes the volume level. The knob 2200 is combined with a graduated level scale 2201. When the knob 2200 is angularly positioned at a minimum level position MIN on the graduated level scale 2201, the slide contact 2502 of the variable resistor 265 is located at the terminal 2504 of the electric resistor 2503. When the knob 2200 is turned clockwise, the slide contact 2502 also rotates clockwise on the electric resistor 2503. When the knob 2200 reaches a maximum level position on the graduated level scale 2201, the slide contact 2502 reaches the terminal 2505 of the electric resistor 2503.

When the slide contact 2502 is located at the terminal 2504 of the electric resistor 2503, the boosted component of the audio signal supplied to the tone control unit in the frequency range, which is determined by the CR value of the circuits 203, 213, 223 and $226_i$ through $226_n$, 233, $243_i$ through $243_n$, and $R_L$, $R_H$, $r_L$, $r_H$, $C_L$, $C_H$ shown in FIGS. 2 through 7, is not attenuated by the variable resistor 265, but is directly applied to the negative input terminal of the noninverting amplifiers 200, 210, 220, 230, 240, 250. When the slide contact 2502 rotates clockwise on the electric resistor 2503, the boosted component of the audio signal in the particular frequency range is attenuated depending on the resistance of the variable resistor 265. When the knob 2200 reaches the maximum level position (MAX), the boosted component of the audio signal in the particular frequency range is minimized in level. The boosted signal component is increased in level when the knob 2200 is turned counterclockwise.

Ganged mechanism 2

The ganged mechanism shown in FIG. 8 may be arranged to have a motor-driven volume control. More specifically, the ganged mechanism shown in FIG. 8 may additionally have a power supply 2700, a motor 2701, and a power transmitting mechanism composed of gears 2702, 2703. The gear 2702 is coaxially coupled to the output shaft of the motor 2701, and is held in mesh with the gear 2703 which is coaxially mounted on the knob shaft 2300. Therefore, when the motor 2701 is energized by the power supply 2700, the knob shaft 2300 and hence the knob 2200 are automatically rotated. The power transmitting mechanism may be of any of known structures other than the gears.

Ganged mechanism 3

Figure 9:
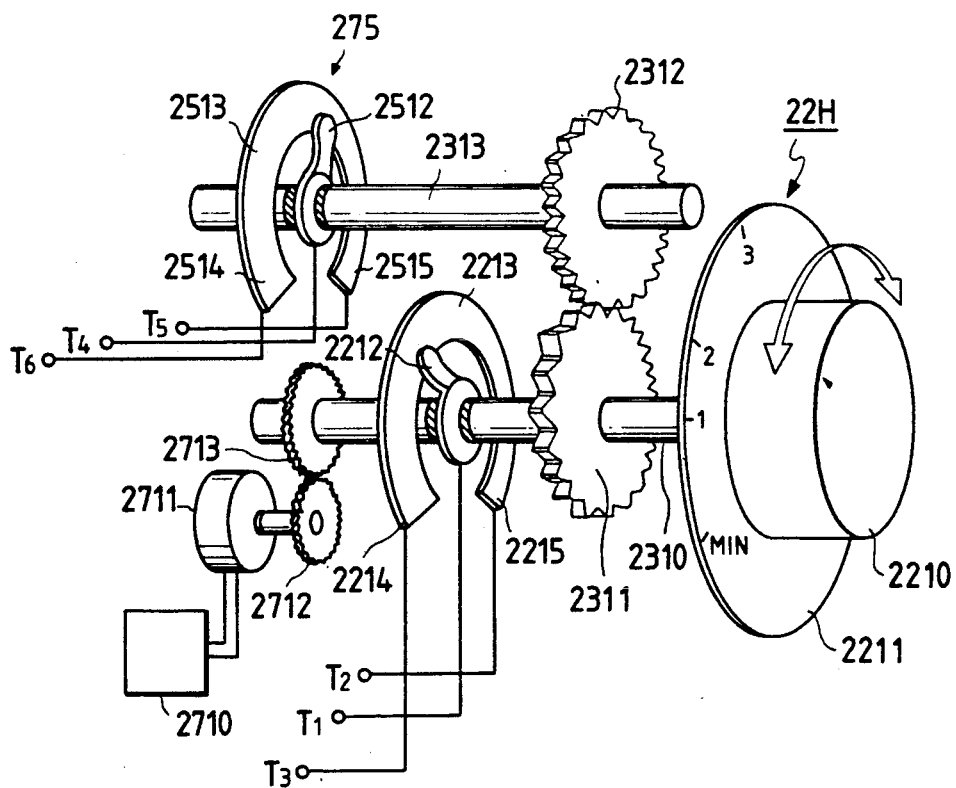

FIG. 9 shows another mechanism comprising a volume control, variable resistors, and a gain control unit for use in an audio reproduction system according to the present invention.

The mechanism shown in FIG. 9 has a knob 2210, a first shaft 2310 coaxially coupled to the knob 2210, a slide contact 2212 mounted on the first shaft 2310 in electrically insulated relation thereto, a gear 2311 mounted on the first shaft 2310, an arcuate electric resistor 2213 fixedly positioned around the first shaft 2310 and held in contact with the slide contact 2212, a gear 2312 meshing with the gear 2311, a second shaft 2313 on which the gear 2312 is mounted, a slide contact 2512 mounted on the second shaft 2313 in electrically insulated relation thereto, and an arcuate electric resistor 2513 fixedly positioned around the second shaft 2313 and held in contact with the slide contact 2512. The knob 2210, the first shaft 2310, the slide contact 2212, and the arcuate electric resistor 2213 jointly serve as a volume control 22H. The second shaft 2313, the slide contact 2512, and the electric resistor 2513 jointly serve as a variable resistor 275 which has the same function as that of each of the variable resistors 205, 214, 225, 235, 245, 255L, 255H shown in FIGS. 2 through 7, i.e., to increase and reduce the gain of the audio signal with the tone control circuit. The first shaft 2310, the gears 2311, 2312, and the second shaft 2313 jointly serve as a gain control unit 23H. Terminals $T_1$ through $t_6$ are connected to the junctions $T_1$ through $T_6$ (e.g., $T_{14}$ through $T_{64}$ in FIG. 2) shown in FIGS. 2 through 7 and 16, 17. The terminals $T_2$, $T_3$ are also connected to respective opposite terminals 2215, 2214 of the electric resistor 2213. The terminal $T_1$ is connected to the slide contact 2212. The terminals $T_5$, $T_6$ are connected to respective opposite terminals 2515, 2514 of the electric resistor 2503. The terminal $T_4$ is connected to the slide contact 2512.

In the embodiment shown in FIG. 9, when the slide contact 2212 is positioned at the terminal 2214 of the electric resistor 2213, the slide contact 2512 is positioned at the terminal 2515 of the electric resistor 2513. The gears 2311, 2312 rotate in opposite directions, respectively. When the slide contact 2212 reaches the terminal 2215 of the electric resistor 2213, the slide contact 2512 reaches the terminal 2514 of the electric resistor 2513. The mechanism shown in FIG. 9 thus operates in the same manner as the mechanism shown in FIG. 8.

Ganged mechanism 4

The ganged mechanism shown in FIG. 9 may be arranged to have a motor-driven volume control. More specifically, the ganged mechanism shown in FIG. 9 may additionally have a power source 2710, a motor 2711, and a power transmitting mechanism composed of gears 2712, 2713. The gear 2712 is coaxially coupled to the output shaft of the motor 2711, and is held in mesh with the gear 2713 which is coaxially mounted on the first shaft 2310. Therefore, when the motor 2711 is energized by the power source 2710, the first shaft 2310 and hence the knob 2210 are automatically rotated. The power transmitting mechanism may be of any of known structures other than the gears. The second shaft 2313 may instead be rotated by a motor.

Ganged mechanism 5

Figure 10:
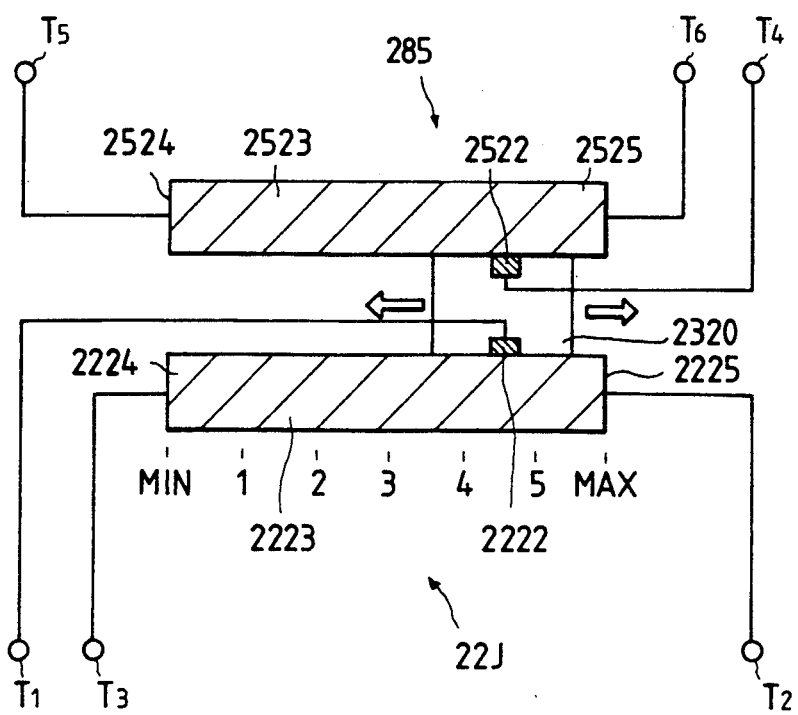

FIG. 10 shows a slide control mechanism comprising a volume control, variable resistors, and a gain control unit for use in an audio reproduction system according to the present invention.

The mechanism shown in FIG. 10 has a slider 2320 serving as a gain control unit and having slide contacts 2222, 2522, a linear electric resistor 2223 contacting the slide contact 2222, and a linear electric resistor 2523 contacting the slide contact 2522. The slider 2320, the slide contact 2222, and the electric resistor 2223 jointly constitute a volume control 22J. The slide contact 2522 and the electric resistor 2523 jointly constitute a variable resistor 285 for increasing and reducing the signal gain in the same manner as the tone control unit as shown in FIGS. 2 through 7. The slider 2320 serves as a gain control unit. Terminals $T_1$ through $T_6$ are connected to the junctions $T_1$ through $T_6$ (e.g., $T_{14}$ through $T_{64}$ in FIG. 2) shown in FIGS. 2 through 7 and 16, 17. The terminals $T_2$, $T_3$ also connected to respective opposite terminals 2225, 2224 of the electric resistor 2223. The terminal $T_1$ is connected to the slide contact 2222. The terminals $T_5$, $T_6$ are connected to respective opposite terminals 2524, 2525 of the electric resistor 2523. The terminal $T_4$ is connected to the slide contact 2522.

In the embodiment shown in FIG. 10, the slide 2320 is slidable between minimum and maximum level positions MIN, MAX of the volume control 22J. When the slide 2320 is located at the minimum level position MIN of the volume control 22J, the slide contact 2222 is positioned at the terminal 2224 of the electric resistor 2223, and the slide contact 2522 is positioned at the terminal 2524 of the electric resistor 2523. When the slider 2320 reaches the maximum level position of the volume control 22J, the slide contact 2222 reaches the terminal 2225 of the electric resistor 2223, and the slide contact 2522 reaches the terminal 2525 of the electric resistor 2523. Thus, the slide control mechanism shown in FIG. 10 operates in the same manner as the mechanism shown in FIG. 8. The slide control mechanism shown in FIG. 10 may also be arranged to have a motor-driven volume control in which the slider 2320 is movable by a motor.

Figure 11A:
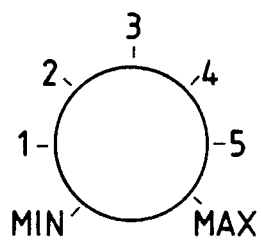
FIGS. 11(A) through 12 are diagrams illustrative of operation of the linked mechanisms.
Figure 11B:
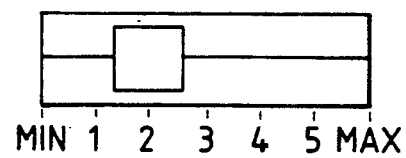
Figure 11C:
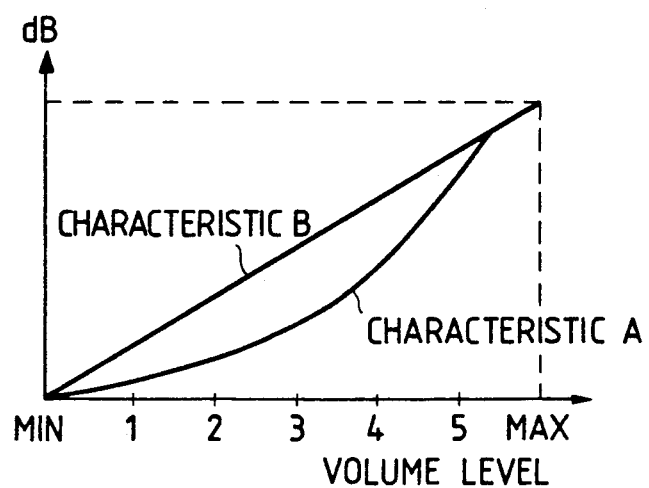
Figure 12:
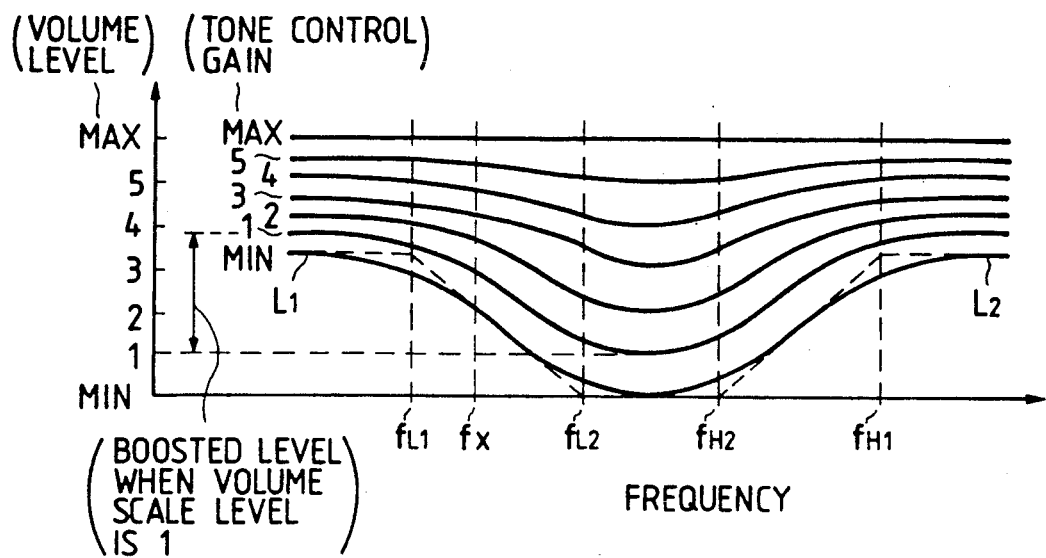

FIGS. 11(A) through 12 show the manner in which the ganged mechanisms shown in FIGS. 8 through 10 operate. FIG. 11(C) show characteristic curves A, B of the volume controls 22G, 22H, 22J shown in FIGS. 8 through 10. The graph of FIG. 11(C) has a horizontal axis representing volume level positions of the volume control knobs, and a vertical axis representing the volume or sound levels (dB). The characteristic curve A increases along a curved pattern, and the characteristic curve A increases linearly.

FIG. 12 shows characteristic curves of the variable resistors 265, 275, 285. The graph of FIG. 12 has a horizontal axis representing frequencies of the audio signal, including a cutoff frequency $f_{L1}$ for the base level boost, a frequency $f_{L2}$ for starting the base level boost, a cutoff frequency $f_{H1}$ for the treble level boost, and a frequency $f_{H2}$ for starting the treble level boost. The characteristic curves shown in FIG. 12 indicate gain levels (dB) plotted with the volume level position as a parameter.

Figure 13A:
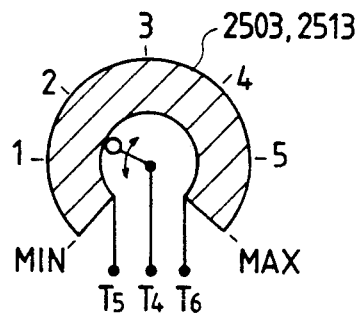
FIGS. 13(A) through 20(C) are diagrams showing gain control units for an audio reproduction system according to the present invention.
Figure 13B:
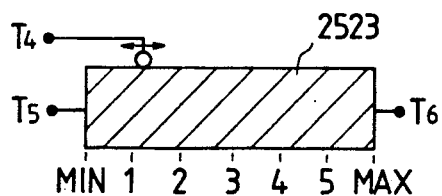
Figure 13C:
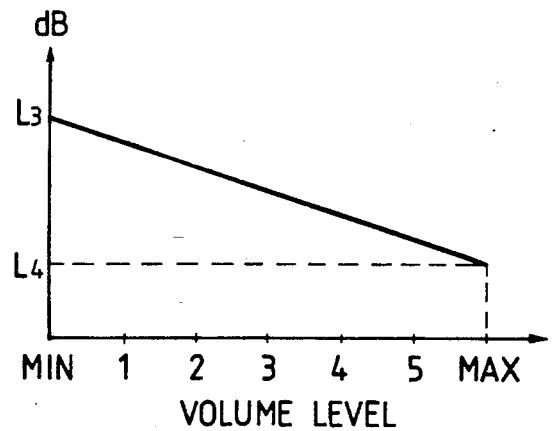
Figure 14A:
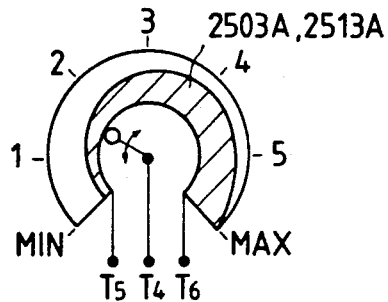
Figure 14B:
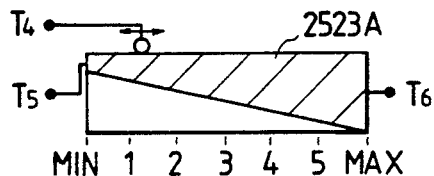
Figure 14C:
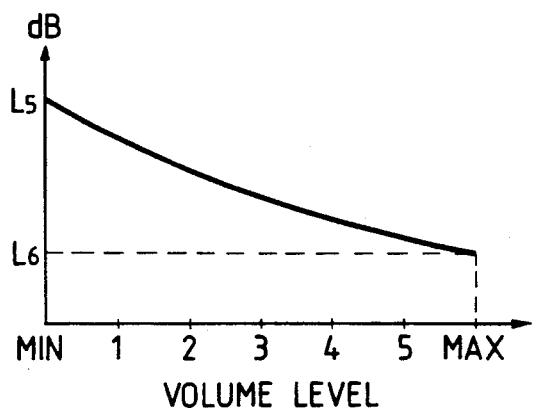
Figure 15A:
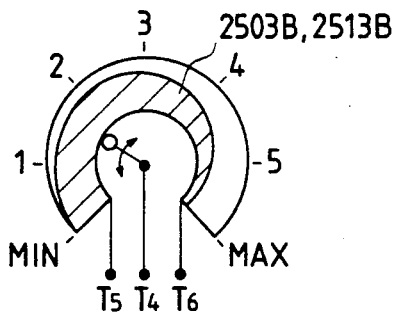
Figure 15B:
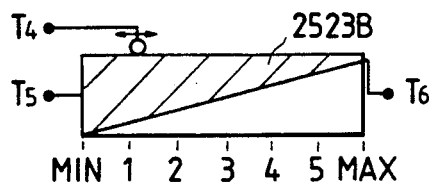
Figure 15C:
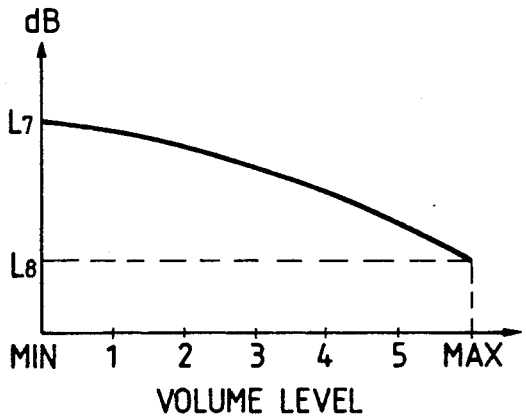
Figure 16:
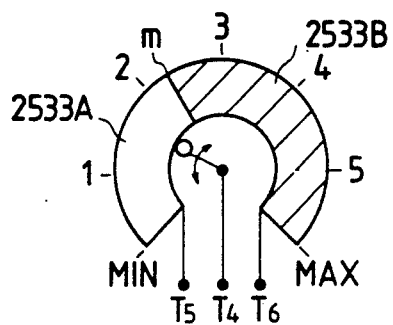
Figure 16:
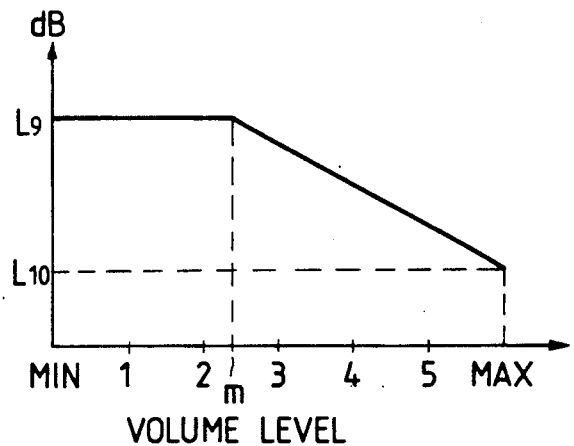
Figure 16:
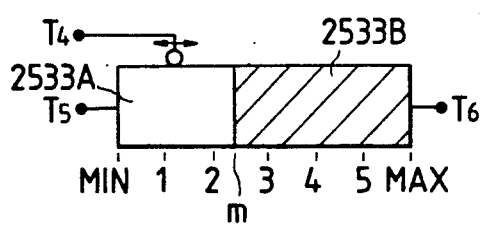

FIG. 13(C) is a graph having a vertical axis which represents gain levels (dB) and a horizontal axis which represents volume level positions, with respect to a desired frequency $f_x$ on the graph of FIG. 12. Comparison between the FIGS. 11(C) and 13(C) indicates that when the volume control is shifted from the minimum level position MIN to the maximum level position MAX, the gain (dB) at the frequency $f_x$ decreases from a level $L_3$ to a level $L_4$. The gain (dB) reduces linearly as shown in FIG. 13(C) because the electric resistors 2503, 2513 or the electric resistor 2523 shown in FIGS. 13(A) and 13(B) has a uniform width across the circumferential or straight direction in which the slide contacts 2502, 2512 or the slide contact 2522 slides. If the electric resistors 2503, 2513 or the electric resistor 2523 is shaped as shown in FIGS. 14(A), 14(B) or 15(A), 15(B), then the gain decreases in a simple curved pattern (FIGS. 14(C), 15(C)).

Moreover, if the electric resistors 2503, 2513 or the electric resistor 2523 has any of various structures or shapes in the circumferential or straight direction in which the slide contacts 2502, 2512 or the slide contact 2522 slides, then the gain decreases in any of various more complex patterns.

FIGS. 16(A), 16(B) show another arrangement in which each of the electric resistors comprises an electrically conductive layer 2533A extending from the minimum level position MIN to a certain level position m of the volume control and an electrically resistive layer 2533B extending from the level position m to the maximum level position MAX, in the circumferential or straight direction in which each of the slide contacts slides. Insofar as the volume control knob is angularly positioned between the minimum level position MIN and the level position m, the gain of the tone control unit remains at a constant level $L_9$ which has originally been set. As the volume control knob turns from the level position m to the maximum level position MAX, the gain decreases down to a minimum level $L_{10}$ (FIG.16(C)). The electric resistor 2533B extending from the level position m to the maximum level position MAX may be of any of various shapes depending on the desired curve along which the gain is to be reduced. The arrangement shown in FIGS.13(A), 13(B) are advantageous in that when the volume control is in a normal range of use, the gain of the tone control unit for the bass and treble boost does not drop from a preset maximum level.

Figure 17A:
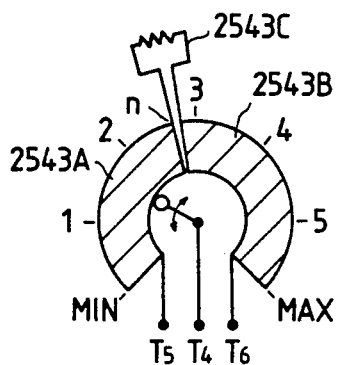
Figure 17B:
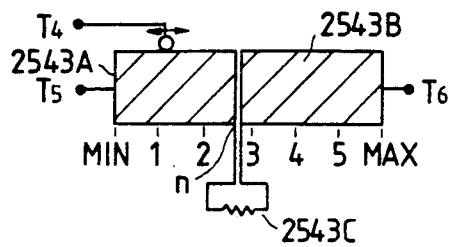
Figure 17C:
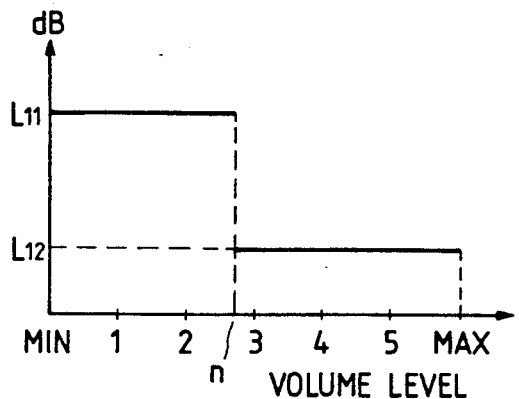

FIGS. 17(A) or 17(B) shows still another arrangement in which each of the electric resistors comprises a first electrically conductive layer 2543A extending from the minimum level position MIN to a certain level position n of the volume control and a second electrically conductive layer 2543B extending from the level position n to the maximum level position MAX, in the circumferential or straight direction in which each of the slide contacts slides. The first and second layers 2543A, 2543B are spaced from each other, and interconnected by an electric resistor 2543C of a predetermined resistance. Insofar as the volume control knob is angularly positioned between the minimum level position MIN and the level position n, the gain of the tone control unit remains at a constant level $L_{11}$ which has originally been set. As the volume control knob turns from the level position n to the maximum level position MAX, the gain is maintained at a level $L_{12}$ which is determined by the electric resistor 2543C (FIG.17(C)). The illustrated arrangement for reducing the tone control gain is simple, and allows an electronic volume control (described later on) to be achieved without a substantial increase in the cost.

Figure 18A:
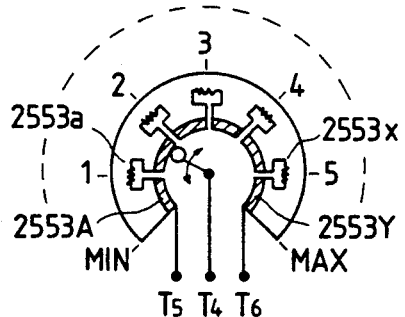
Figure 18C:
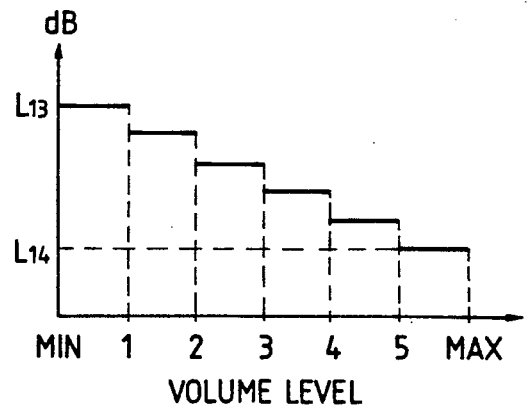
Figure 18B:
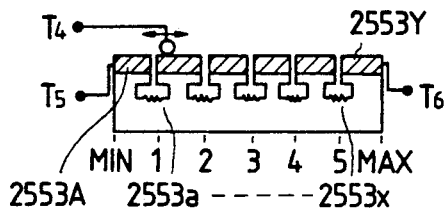

As shown in FIGS. 18(A) or 18(B), each of the electric resistors may be composed of a plurality of electrically conductive layers 2553A through 2553Y with gaps left therebetween, and electric resistors 2553a through 2553x may be connected between the electrically conductive layers 2553A through 2553Y. The volume control arrangements shown in FIGS. 18(A) or 18(B) can reduce the tone control gain stepwise from a preset level $L_{13}$ to a minimum level $L_{14}$ (FIG.18(C)).

Figure 19A:
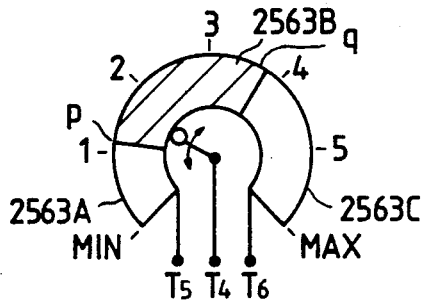
Figure 19C:
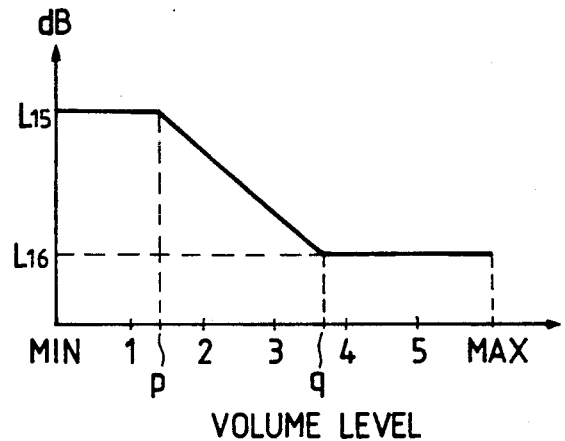
Figure 19B:
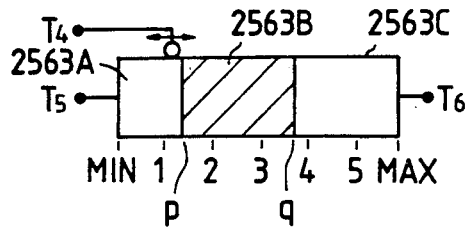

FIGS. 19(A), 19(B) show yet another volume control arrangement in which each of the electric resistors comprises an electrically conductive layer 2563A extending from the minimum level position MIN to a first level position p of the volume control, an electrically resistive layer 2563B extending from the first level position p to a second level position q, and an electrically conductive layer 2563C extending from the second level position q to the maximum level position MAX, in the circumferential or straight direction in which each of the slide contacts slides. While the volume control knob is being angularly positioned between the minimum level position MIN and the first level position p, the gain of the tone control unit remains to be of a constant level $L_{15}$ which has been set. When the volume control knob turns from the first level position p to the second level position q, the control control gain decreases along a curve which is determined by the structure or shape of the electric resistor 2563B. When the volume control knob turns from the second level position q to the maximum level position MAX, the gain is maintained at a level $L_{16}$ (FIG.19(C)). With the arrangments shown in FIGS. 19(A), 19(B), the tone control gain is reduced relatively early as the volume level is increased, and then is kept at a constant level when the volume level exceeds a certain level position.

Figure 20A:
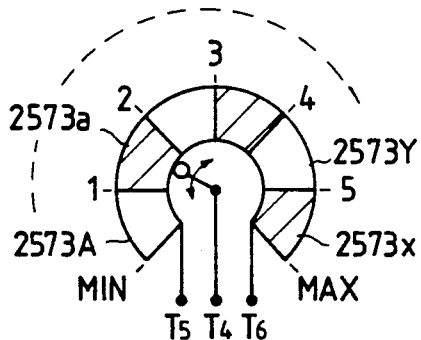
Figure 20C:
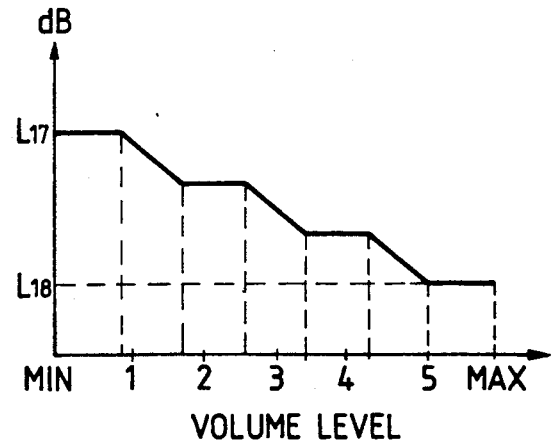
Figure 20B:
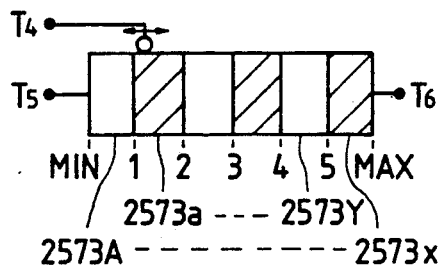

Furthermore, as shown in FIGS. 20(A), 20(B), each of the electric resistors may be composed of alternately arranged electrically conductive layers 2573A through 2573Y and electrically resistive layers $2573a$ through $2573x$. With this volume control arrangement, the tone control gain can be reduced stepwise from a preset level $L_{17}$ to a minimum level $L_{18}$ (FIG. 20(C)).

In the arrangements shown in FIGS. 13(A), 13(B) through 20(A), 20(B), the minimum gain levels $L_4$, $L_6$, $L_8$, $L_{10}$, $L_{12}$, $L_{14}$, $L_{16}$, $L_{18}$ can be set to zero by suitably selecting the values of the variable resistors 205, 215, 225, 235, 245, 255L, 255H, 2503, 2513, 2523, 2503A, 2513A, 2523A, 2503B, 2513B, 2523B, 2533B, 2543C, $2553a$ through $2553x$, 2563B and $2573a$ through $2573x$. Such a gain level setting is effective to prevent any bass boost from being distored when the tone control gain is preset to an allowable limit level free of distortions at the volume control level position MAX.

Seventh Embodiment

Figure 21:
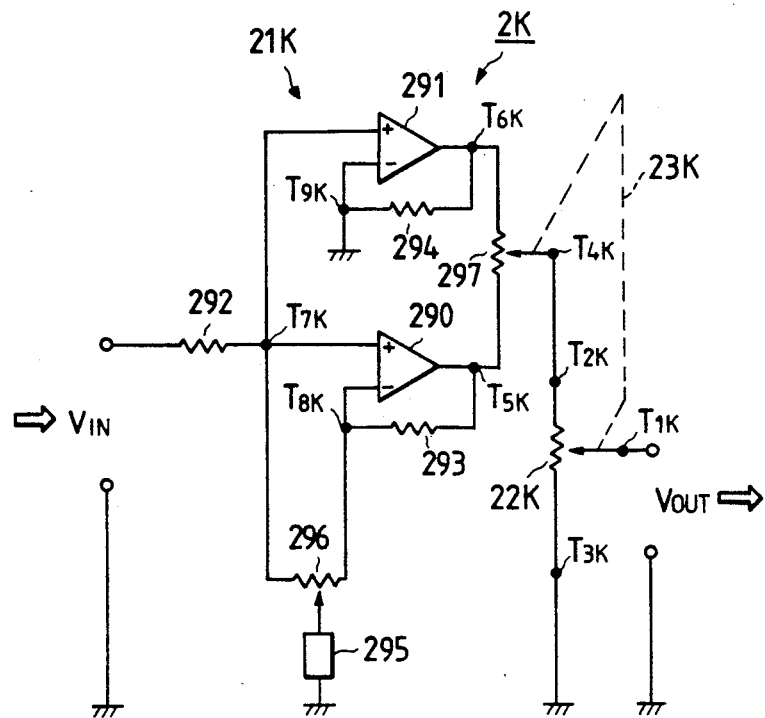
FIGS. 21 and 22 are circuit diagrams of frequency characteristics control devices according to seventh and eighth embodiments of the present invention.

FIG. 21 shows a frequency characteristics control device according to a seventh embodiment of the present invention, for use in an audio reproduction system. The frequency characteristics control device, generally denoted at 2K, comprises a tone control circuit 21K as a tone control unit, a volume control 22K as a volume control unit, and a gain control unit 23K.

The tone control circuit 21K comprises noninverting amplifiers 290, 291, resistors 292, 293, 294, a circuit 295 composed of series- and parallel-connected capacitors and resistors, and variable resistors 296, 297.

The noninverting amplifiers 290, 291 have positive input terminals which are connected at a junction $T_{7K}$ to one terminal of the resistor 292, whose other terminal serves as a positive input terminal of the frequency characteristics control device 2K. The circuit 295 has one terminal grounded and another terminal connected to the movable contact of the variable resistor 296. One fixed terminal of the variable resistor 296 is connected to the junction $T_{7K}$, and the other fixed terminal thereof is connected at a junction $T_{8K}$ to a negative input terminal of the noniverting amplifier 290 and also to one terminal of the resistor 293. The other terminal of the resistor 293 is joined at a junction $T_{5K}$ to the output terminal of the noninverting amplifier 290, the resistor 293 serving as a negative feedback resistor connected across the noninverting amplifier 290. The junction $T_{5K}$ is coupled to one fixed terminal of the variable resistor 297.

The junction $T_{7K}$ is connected to a positive input terminal of the noninverting amplifier 291. The resistor 294 has a terminal connected at a grounded junction $T_{9K}$ to a negative input terminal of the noninverting amplifier 291. The other terminal of the resistor 294 is connected at a junction $T_{6K}$ to the output terminal of the noninverting amplifier 291, the resistor 294 serving as a negative feedback resistor connected across the noninverting amplifier 291. The junction $T_{6K}$ is coupled to the other terminal of the variable resistor 297.

The movable contact of the variable resistor 297 is connected to a junction $T_{4K}$ to one fixed terminal of the volume control 22K in the form of a variable resistor. The other fixed terminal $T_{3K}$ of the volume control 22K is connected to ground. The volume control 212K has a movable terminal $T_{1K}$ serving as a positive output terminal of the frequency characteristics control device 2K. The movable contact of the variable resistor 297 and the movable contact of the volume control 22K are ganged with each other by the gain control unit 23K, When the volume control 22K is shifted from a lower scale level toward a higher scale level, the boosted or reduced level (tone control level) of the audio signal in the determined frequency range is continuously or discontinuously lowered directly.

In the frequency characteristics control device 2K, the boosted component of the audio signal applied between input terminals $V_{IN}$ in the frequency range which is determined by the CR value of the circuit 295 is amplified by the noninverting amplifier 290. The attenuated component of the audio signal in the frequency range which is determined by the CR value of the circuit 295 is amplified by the noninverting amplifier 291. The boosted component and the attenuated component are added to each other at the variable resistor 297, and transmitted at a certain gain. The transmitted output signal is finally increased or reduced in level by the volume control 22K. The control of the tone control gain by the variable resistor 297 is mechanically or electrically ganged with the movement of the volume control 22K through the gain control unit 23K. More specifically, when the volume control 22K is shifted toward a higher scale level, the movable contact of the variable resistor 297 is shifted to present a higher resistance to the amplified boosted component, i.e., in a direction to reduce the electric current flowing between the junctions $T_{5K}$ and $T_{4K}$.

Thus, as the volume control 22K is shifted from a lower scale level toward a higher scale level, the gain level of the audio signal in the determined frequency range is continuously or discontinuously lowered. When the volume control 22K is shifted toward a lower scale level, the above process is reversed.

Eighth Embodiment

Figure 22:
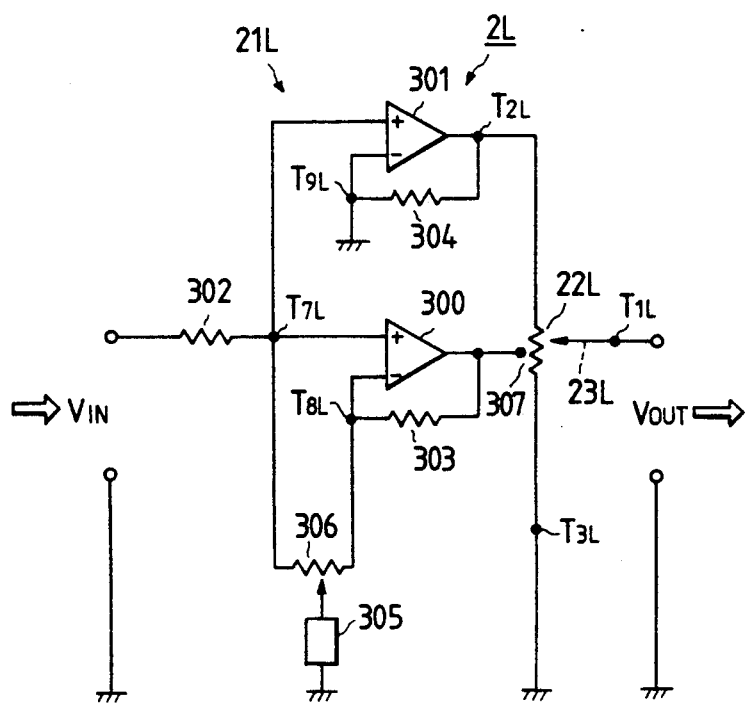

FIG. 22 shows a frequency characteristics control device according to an eighth embodiment of the present invention, for use in an audio reproduction system. The frequency characteristics control device, generally denoted at 2L, comprises a tone control circuit 21L as a tone control unit, and a volume control 22L as a volume control unit. The volume control 22L has an output varying mechanism such as a knob shaft or slider which serves as a gain control unit 23K. This output varying mechanism doubles as a gain control unit 23L.

The tone control circuit 21L comprises noninverting amplifiers 300, 301, resistors 302, 303, 304, a circuit 305 composed of series- and parallel-connected capacitors and resistors, and a variable resistor 306, and a center tap 307 of the volume control 22L.

The noninverting amplifiers 300, 301 have positive input terminals which are connected at a junction $T_{7L}$ to one terminal of the resistor 302, whose other terminal serves as a positive input terminal of the frequency characteristics control device 2L. The circuit 305 has one terminal grounded and another terminal connected to the movable contact of the variable resistor 306. One fixed terminal of the variable resistor 306 is connected to the junction $T_{7L}$, and the other fixed terminal thereof is connected at a junction $T_{8L}$ to a negative input terminal of the noninverting amplifier 300 and also to one terminal of the resistor 303. The other terminal of the resistor 303 is joined to the output terminal of the noninverting amplifier 300 and also to the center tap 307 of the volume control 22L.

The junction $T_{7L}$ is connected to a positive input terminal of the noninverting amplifier 301. The resistor 304 has a terminal connected at a grounded junction $T_{9L}$ to a negative input terminal of the noninverting amplifier 301. The other terminal of the resistor 304 is connected at a junction $T_{2L}$ to the output terminal of the noninverting amplifier 301 and also to one fixed terminal of the volume control 22L in the form of a variable resistor.

The other fixed terminal of the volume control 22L is grounded. The volume control 22L has a movable terminal $T_{1L}$ serving as a positive output terminal of the frequency characteristics control device 2L.

As long as the volume control knob is angularly positioned between a minimum level position MIN and the position of the center tap, the frequency characteristics control device 2L operates in the same manner as an ordinary tone control circuit. When the volume control knob exceeds the center tap position, the increased gain level of the tone control circuit is gradually reduced. The increased gain level is finally reduced to zero when the volume control knob reaches the maximum, level position MAX.

As the volume control 22L is shifted from a lower scale level toward a higher scale level, the boosted or reduced level (tone control level) of the audio signal in the determined frequency range is continously or discontinuously lowered. When the volume control 22L is shifted toward a lower scale level, the above process is reversed.

Ninth Embodiment

Figure 23:
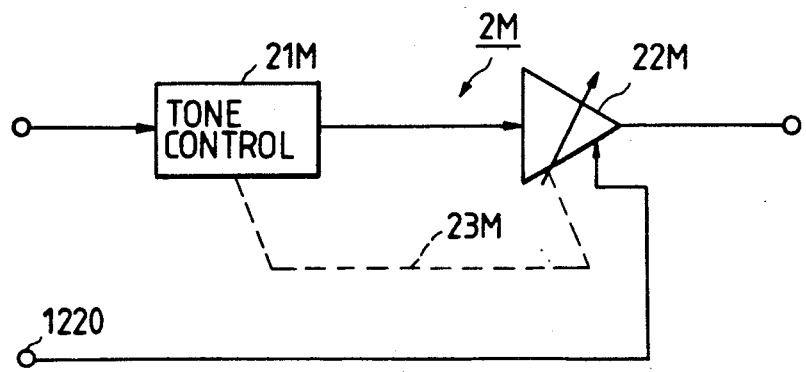
FIGS. 23 through 25 are block diagrams of frequency characteristics control devices according to ninth through eleventh embodiments of the present invention.

FIG. 23 shows a frequency characteristics control device according to a ninth embodiment of the present invention, for use in an audio reproduction system. The frequency characteristics control device, generally denoted at 2M, comprises a tone control unit 21M, and electronic volume control 22M as a volume control unit, and a gain control unit 23M.

The tone control unit 21M and the gain control unit 23M are identical to those described above with reference to the previous embodiments. However, the electronic volume control 22M comprises a voltage controlled amplifier (VCA) in the form of an IC. The electronic volume control 22A has a control terminal 1220, and electrically increases or reduces an output level depending on the volume scale position which is represented by a signal applied to the control terminal 1220, unlike an ordinary volume control whose resistance is variable by a manually operated or power-operated mechanism. The gain control unit 23M detects the volume level selected by the electronic volume control 22M. When the volume level is varied from a lower level toward a higher level, the gain control unit 23M causes the tone control unit 21M to continuously or discontinuously lower, with a mechanical or an electric mechanism, the boosted or reduced level (tone control level) of the audio signal in the determined frequency range. When the volume level set by the electronic volume control 22M is lowered, the above process is reversed.

Tenth Embodiment

Figure 24:
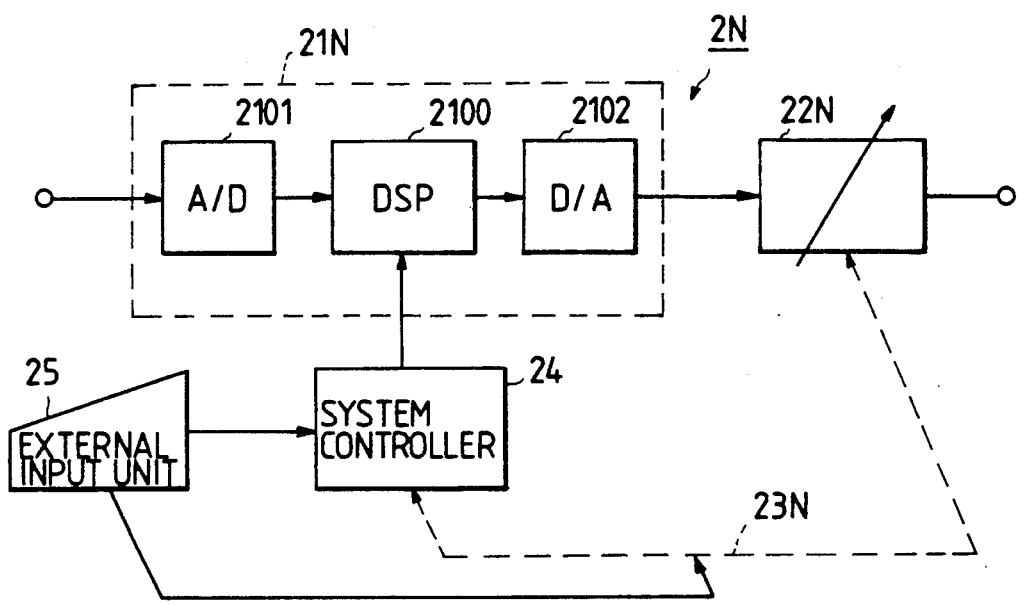

FIG. 24 shows a frequency characteristics control device according to a tenth embodiment of the present invention, for use in an audio reproduction system. The frequency characteristics control device, generally denoted at 2N, comprises a tone control unit 21N, a volume control unit 22N, a gain control unit 23N, a system controller 24, and an external input unit 25.

The tone control unit 21N comprises a digital signal processor (DSP) 2100, an analog-to-digital converter 2101, and a digital-to-analog converter 2102.

The DSP 2100 has a multiplier (not shown), and is in the form of a microcomputer for processing digital signals on a real-time basis through high-speed operations such as a pipeline control process.

The system controller 24 includes a microprocessor, a RAM, and a ROM (not shown), and controls the DSP 2100 and the volume control unit 22N according to a program stored in the ROM or an externally instructed procedure.

The gain control unit 23N is capable of detecting a volume level selected by the volume control unit 22N and mechanically or electrically transmitting the detected volume level to the system controller 24, or controlling the volume level of the volume control unit 22N in response to a command signal that is mechanically or electrically transmitted from the system controller 24.

The external input unit 25 includes a rotary knob, a slide knob, and a keyboard, and controls the volume control unit 23N directly or through the system controller 24.

When the volume control unit 22N is shifted from a lower scale level toward a higher scale level, the boosted or reduced level (tone control level) of the audio signal in the frequency range that is set by the tone control unit 21N is continuously or discontinuously lowered mechanically or electrically. When the volume control unit 22N is shifted toward a lower scale level, the above process is reversed.

Eleventh Embodiment

Figure 25:
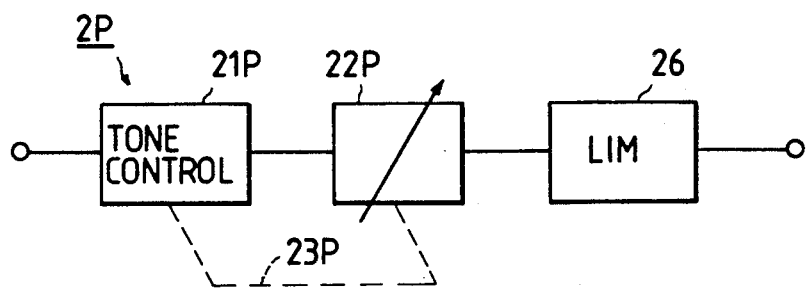

FIG. 25 shows a frequency characteristics control device according to an eleventh embodiment of the present invention, for use in an audio reproduction system. The frequency characteristics control device, generally denoted at 2P, comprises a tone control unit 21P, a volume control unit 22P, and a limiter 26 for limiting the gain of the audio signal from the volume control unit 22P. When the volume control unit 22P is shifted toward a higher scale level, the boosted level (tone control level) of the audio signal in the frequency range that is set by the tone control unit 21P is continuously or discontinuously lowered mechanically or electrically. Even when the audio signal is picked up from an audio source of such a wide dynamic range that the reproduced sound would be distored after the boosted level is lowered by the above process, the reproduced sound is prevented from being distorted by the limiter 26.

The principles of the present invention are particularly useful when embodied in audio amplifiers whose gain is set to an allowable limit level free of distortions at the maximum volume level position so that the reproduced sound gives the listener powerful impressions. In such audio amplifiers, when the volume level is low, the tone control is effected, and when the volume level is maximum or nearly maximum, the tone control is defeated or almost defeated, thus preventing the reproduced sound from being distorted.

The variable resistor of the tone control circuit which is ganged with the volume control may be given any of various different characteristics.

According to the present invention, audio signals can be reproduced with natural hearing sensations and powerful impressions in the full volume range. The audio reproduction system can be incorporated into ordinary audio devices simply by adding a relatively simple circuit.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

Twelfth Embodiment

Even though the tone control units can vary the level of tone control arbitrarily in the previous embodiments described above with reference, the tone control unit can fix the level of tone control set beforehand.

Figure 26:
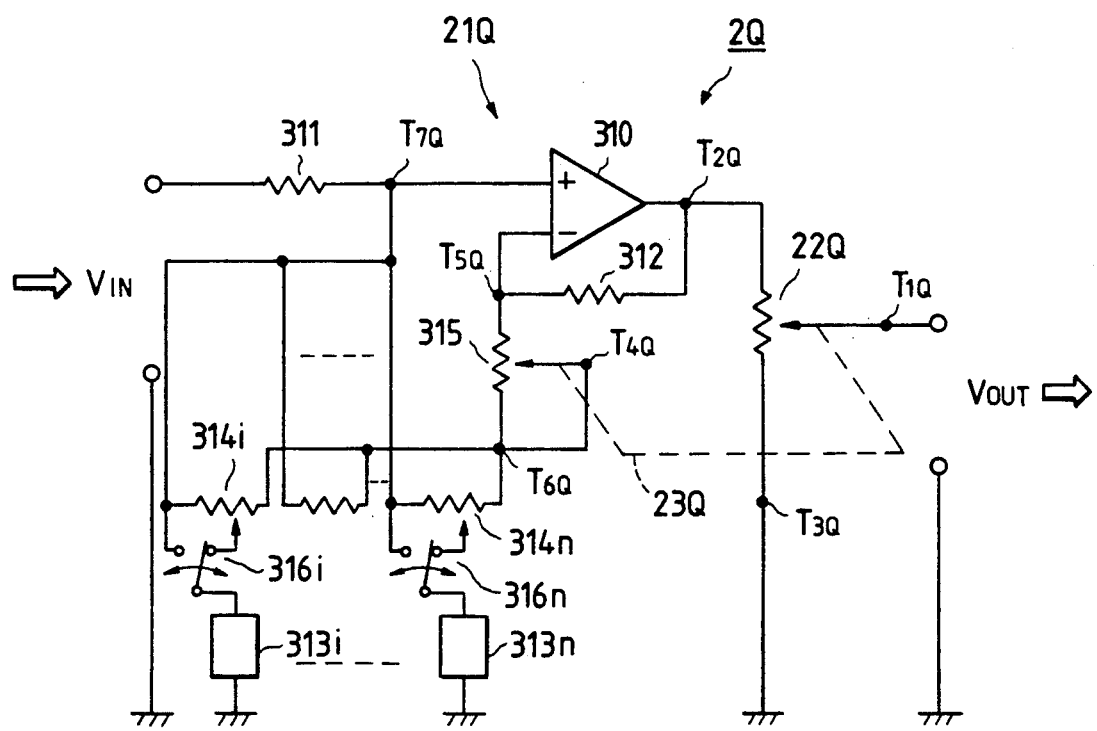
FIG. 26 is a circuit diagram of frequency characteristics control device according to twelfth embodiment of the present invention.

FIG. 26 shows a frequency characteristics control device 2Q according to a twelfth embodiment of the present invention, for use in an audio reproduction system.

The frequency characteristics control device 2Q comprises a tone control circuit 21Q as a tone control unit, a volume control 22Q as a volume control unit, and a gain control unit 23Q.

The tone control circuit 21Q comprises a noninverting amplifier 310, resistors 311, 312, a plurality of circuits $313_i$ through $313_n$ each composed of series- and parallel-connected capacitors and resistors, and a plurality of variable resistors $314_i$ through $314_n$ and a plurality of switches $316_i$ through $316_n$.

The noninverting amplifier 310 has a positive input terminal which is connected at a junction $T_{7Q}$ to one terminal of the resistor 311, whose other terminal serves as a positive input terminal of the frequency characteristics control device 2Q. The circuits $313_2$ through $313_n$ have one respective terminals grounded, and other terminals connected to the switches $316_i$ through $316_n$. These switches $316_i$ through $316_n$ are connected to the movable contacts of the respective variable resistors $314_i$ through $314_n$, which have one fixed terminals connected to the junction $T_{7Q}$. The other fixed terminals of the variable resistors $314_i$ through $314_n$ are connected at a junction $T_{6Q}$ to one fixed terminal of the variable resistor 315 and also to the movable terminal $T_{4Q}$ of the variable resistor 315. The other fixed terminal of the variable resistor 315 is connected at a junction $T_{5Q}$ to a negative input terminal of the noninverting amplifier 310 and also to one terminal of the resistor 312. The other terminal of the resistor 312 is joined at a junction $T_{2Q}$ to the output terminal of the noninverting amplifier 310, the resistor 312 serving as a negative feedback resistor connected across the noninverting amplifier 310. The junction $T_{2Q}$ is coupled to one fixed terminal of the volume control 22Q in the form of a variable resistor, whose other fixed terminal is connected to ground. The volume control 2Q has a movable terminal $T_{1Q}$ serving as a positive output terminal of the frequency characteristics control device 2Q. The movable contact of the variable resistor 315 and the movable contact of the volume control 22Q are ganged with each other by the gain control unit 23Q.

When the volume control 22Q is shifted from a lower scale level toward a higher scale level, the boosted or emphasized level of the audio signal in the plural frequency ranges, which are fixed selectively by the tone control circuit 21Q, is continuously or discontinuously lowered.

Other examples of the tone control unit which can fix the level of the tone are discussed below. A tone control unit may determine selectively the frequency characteristics in accordance with the type of music such as the jazz, the classic or the like. A control unit for the car audio stereo may fix selectively the frequency characteristics depending upon the kind of car for harmonizing with the acoustic properties of passenger compartment of the car. A tone control unit may set suitable frequency characteristics of the listening room which are measured beforehand. A tone control unit may switch selectively the frequency characteristics which are fixed at a listener's request. Further, a tone control unit may select or switch the frequency characteristics which are set and fixed beforehand by utilizing the DSP shown in FIG. 24.

What is claimed is:

1. An audio reproduction system comprising:
    an amplifier for amplifying a gain of a reproduced audio signal supplied thereto in a full effective frequency range, said amplifier having a positive and a negative input terminal and an output terminal, and said output terminal outputting an amplified audio signal;
    a first variable resistor for controlling a gain of the amplified audio signal, said first variable resistor having two ends and a movable contact, one end of said two ends of said first variable resistor being connected to said output terminal of said amplifier, and said movable contact of said first variable resistor outputting a first controlled output;
    a negative feedback loop circuit for feeding back a part of the amplified audio signal to said negative input terminal of said amplifier;
    a tone control unit for controlling a gain of a part of the reproduced audio signal in a predetermined frequency range, said tone control unit having an input and an output terminal, said input terminal of said tone control unit being connected to said positive input terminal of said amplifier, and said output terminal of said tone control unit outputting a tone-controlled audio signal;
    a second variable resistor for controlling a gain of the tone-controlled audio signal, said second variable resistor having two ends and a movable contact, said movable contact of said second variable resistor being connected to said output terminal of said tone control unit, and one end of said two ends of said second variable resistor being connected to said negative input terminal of said amplifier and outputting a second controlled output; and
    a gang control unit for linking said movable contact of said first variable resistor to said movable contact of said second variable resistor in order to control a gain of the second controlled output at said second variable resistor depending on a degree to which a gain of the first controlled output at said first variable resistor has been reached.

2. An audio reproduction system according to claim 1, wherein said gang control unit comprises means for controlling said second variable resistor to reduce the gain of the second controlled output when the gain of the first controlled output at said first variable resistor is increased to a higher level, and for controlling said second variable resistor to increase the gain of the second controlled output when the gain of the first controlled output at said first variable resistor is reduced to a lower level.

3. An audio reproduction system according to claim 1, wherein said tone control unit comprises a resonant circuit for extracting a signal component in the predetermined frequency range, said resonant circuit including an RC network circuit, and a third variable resistor for controlling a gain of the signal component in the predetermined frequency range, said third variable resistor having two ends and a movable contact, one end of said two ends of said third variable resistor being connected to said input terminal of said tone control unit, another end of said two ends of said third variable resistor being connected to said output terminal of said tone control unit, and said movable contact of said third variable resistor being connected to said resonant circuit.

4. An audio reproduction system according to claim 3, wherein said second variable resistor provides the function of said third variable reistor.

5. An audio reproduction system according to claim 3, wherein said tone control unit comprises a plurality of resonant circuits.

6. An audio reproduction system according to claim 3, wherein said third variable resistor comprises a plurality of variable resistors, and said resonant circuit comprises a plurality of resonant circuits, said plurality of resonant circuits being associated with respective ones of said plurality of variable resistors.

7. An audio reproduction system according to claim 3, wherein said third variable resistor includes switch means for selectively switching the gain of the signal component in the predetermined frequency range of said part of said reproduced audio signal between a predetermined level and a zero level.

8. An audio reproduction system according to claim 3, wherein at least one of said first variable resistor and said second variable resistor comprises a resistor and a slide contact slidable on said resistor in a direction.

9. An audio reproduction system according to claim 8, wherein said first variable resistor comprises a first arcuate resistor extending around an axis, and a first slide contact rotatable about said axis for sliding movement on said first arcuate resistor, and said second variable resistor comprises a second arcuate resistor extending around an axis, and a second slide contact rotatable about said last-mentioned axis for sliding movement on said second arcuate resistor, said gang control unit comprising means for rotating said second slide contact in the same direction as said first slide contact.

10. An audio reproduction system according to claim 8, wherein said first variable resistor comprises a first arcuate resistor extending around an axis, and a first slide contact rotatable about said axis for sliding movement on said first arcuate resistor, and said second variable resistor comprises a second arcuate resistor extending around an axis, and a second slide contact rotatable about said last-mentioned axis for sliding movement on said second arcuate resistor, said gang control unit comprising means for rotating said second slide contact in the opposite direction to said first slide contact.

11. An audio reproduction system according to claim 8, wherein said first variable resistor comprises a first linear resistor, and a first slide contact linearly slidable on said first linear resistor, and said second variable resistor comprises a second linear resistor, and a second slide contact linearly slidable on said second linear resistor, said gang control unit comprising means for linearly moving said second slide contact in the same direction as said first slide contact.

12. An audio reproduction system according to claim 8, wherein said resistor of said second variable resistor has a width which is constant in a direction perpendicular to said direction in which the slide contact moves.

13. An audio reproduction system according to claim 8, wherein said resistor of said second variable resistor has a width which is progressively greater in a spatial direction which is perpendicular to said direction in which the slide contact moves, wherein change in said width is determined with respect to said direction.

14. An audio reproduction system according to claim 8, wherein said resistor of said second variable resistor has a width which is progressively smaller in a spatial direction which is perpendicular to said direction in which the slide contact moves, wherein change in said width is determined with respect to said direction.

15. An audio reproduction system according to claim 12, wherein said resistor of said second variable resistor comprises a plurality of resistor members which are discontinuous in said direction in which said slide contact slides, and a conductive member connected between said each resistor member.

16. An audio reproduction system according to claim 12, wherein said resistor of said second variable resistor comprises a plurality of resistor members which are discontinuous in said direction in which said slide contact slides, and another resistor member connected between said each resistor member.

17. An audio reproduction system according to claim 1, further comprising a gain limiting unit for limiting the gain of the first controlled output.

18. An audio reproduction system according to claim 1, wherein said tone control unit comprises means for varying arbitrarily a quantity for controlling the gain of the signal in the predetermined frequency range of the reproduced audio signal supplied thereto.

19. An audio reproduction system comprising: an amplifier for amplifying a gain of a reproduced audio signal supplied thereto in a full effective frequency range, said amplifier having a positive and a negative input terminal and an output terminal, and said output terminal outputting an amplified audio signal;

a first variable resistor for controlling a gain of the amplified audio signal, said first variable resistor having two ends and a movable contact, one end of said two ends of said first variable resistor being connected to said output terminal of said amplifier, and said movable contact of said first variable reistor outputting a first controlled output;

a negative feedback loop circuit for feeding back a part of the amplified audio signal to said negative input terminal of said amplifier;

a tone control unit for controlling a gain of a part of the reproduced audio signal in a predetermined frequency range, by selecting a gain of a signal from a plurality of predetermined gain characteristics, said tone control unit having an input and an output terminal, said input terminal of said tone control unit being connected to said positive input terminal of said amplifier, and said output terminal of said tone control unit outputting a tone-controlled audio signal;

a second variable resistor for controlling a gain of the tone-controlled audio signal, said second variable resistor having two ends and a movable contact, said movable contact of said second variable resistor being connected to said output terminal of said tone control unit, and one end of said two ends of said second variable resistor being connected to said negative input terminal of said amplifier and outputting a second controlled output; and a gang control unit for linking said movable contact of said first variable resistor to said movable contact of said second variable resistor in order to control a gain of the second controlled output at said second variable resistor depending on a degree to which a gain of the first controlled output at said first variable resistor has been reached.

* * * * *